(12) United States Patent
Choi et al.

(10) Patent No.: US 9,287,309 B2
(45) Date of Patent: Mar. 15, 2016

(54) ISOLATION STRUCTURE HAVING A SECOND IMPURITY REGION WITH GREATER IMPURITY DOPING CONCENTRATION SURROUNDS A FIRST IMPURITY REGION AND METHOD FOR FORMING THE SAME, AND IMAGE SENSOR INCLUDING THE ISOLATION STRUCTURE AND METHOD FOR FABRICATING THE IMAGE SENSOR

(71) Applicant: SK hynix Inc., Gyeonggi-do (KR)

(72) Inventors: Chung-Seok Choi, Gyeonggi-do (KR); Jang-Won Moon, Gyeonggi-do (KR); Jong-Chae Kim, Gyeonggi-do (KR); Do-Hwan Kim, Gyeonggi-do (KR); Kyoung-Oug Ro, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 284 days.

(21) Appl. No.: 14/010,960

(22) Filed: Aug. 27, 2013

(65) Prior Publication Data

US 2014/0353468 A1 Dec. 4, 2014

(30) Foreign Application Priority Data

May 31, 2013 (KR) .......................... 10-2013-0062477
May 31, 2013 (KR) .......................... 10-2013-0062478

(51) Int. Cl.
*H01L 27/146* (2006.01)
*H01L 29/06* (2006.01)

(52) U.S. Cl.
CPC ........ *H01L 27/1463* (2013.01); *H01L 27/1464* (2013.01); *H01L 29/0646* (2013.01); *H01L 29/0649* (2013.01); *H01L 27/14643* (2013.01)

(58) Field of Classification Search
CPC ............ H01L 27/1463; H01L 27/1464; H01L 29/0646; H01L 29/0649; H01L 27/14643; H01L 27/14609; H01L 27/14689; H01L 27/1443; H01L 21/76229; H01L 21/76202; H01L 21/761; H01L 21/76205; H01L 21/823878; H01L 21/74; H01L 27/00; H01L 21/7621; H01L 21/76; H01L 29/0642
USPC ........................ 250/208.1, 214.1, 214 R, 239; 257/290–292, 440, 446, 499, 509, 544; 348/294–311
See application file for complete search history.

(56) References Cited

U.S. PATENT DOCUMENTS

| 2010/0025687 | A1 | 2/2010 | Han |
| 2012/0033119 | A1* | 2/2012 | Shinohara ..................... 348/302 |
| 2012/0077301 | A1 | 3/2012 | Ahn et al. |
| 2013/0015325 | A1* | 1/2013 | Ahn ........................... 250/208.1 |
| 2014/0264719 | A1* | 9/2014 | Chou et al. .................... 257/506 |

FOREIGN PATENT DOCUMENTS

KR   1020100037210   4/2010

* cited by examiner

*Primary Examiner* — Que T Le
(74) *Attorney, Agent, or Firm* — IP & T Group LLP

(57) ABSTRACT

An isolation structure and method of forming the same. The isolation structure includes a first isolation structure having including an insulation layer formed in a trench in a substrate and a second isolation structure, formed on the first isolation structure. The second isolation structure includes a first impurity region formed in the substrate, the first impurity region having a first impurity doping concentration, and a second impurity region that is formed around the first impurity region, the second impurity region having a second impurity doping concentration that is greater than the first doping concentration.

20 Claims, 17 Drawing Sheets

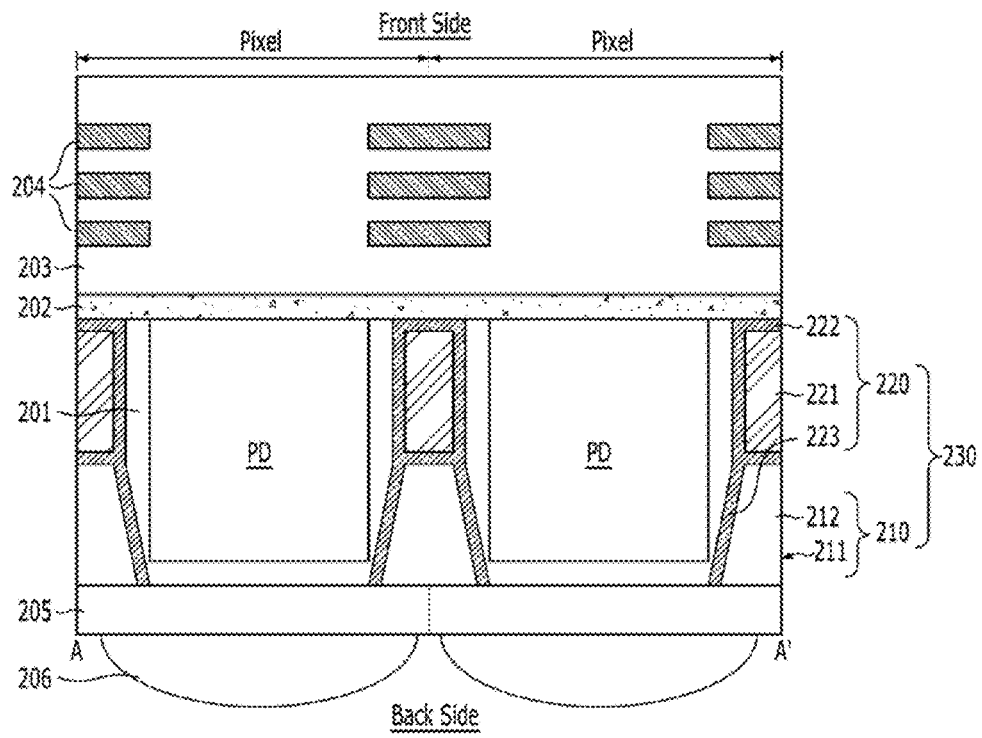
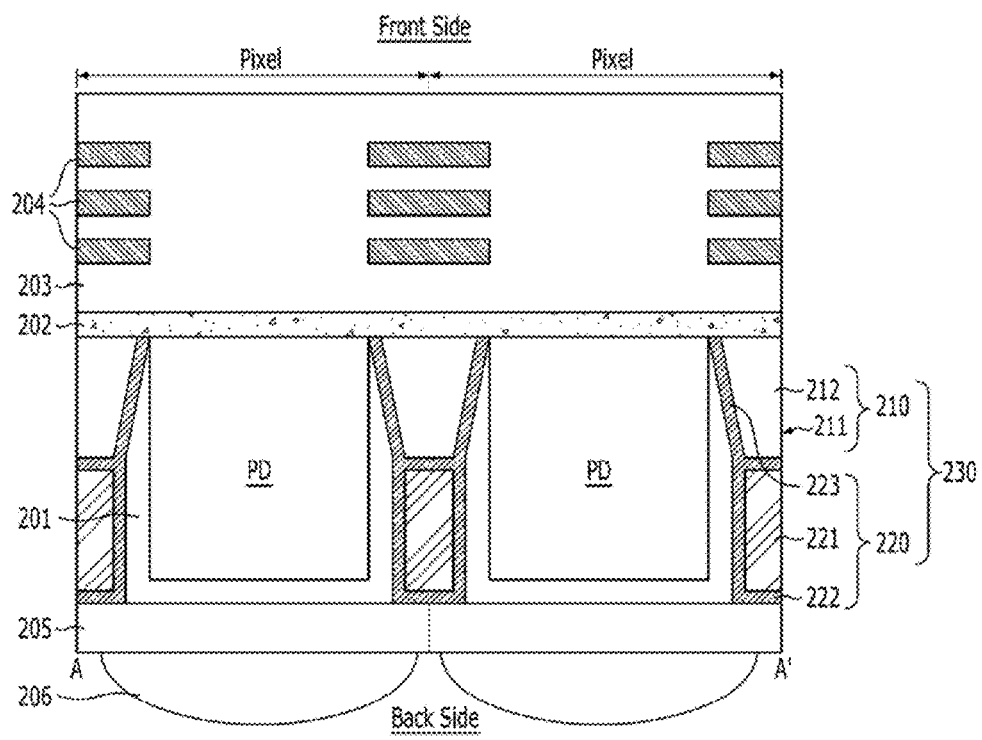

ISOLATION STRUCTURE HAVING A SECOND IMPURITY REGION WITH GREATER IMPURITY DOPING CONCENTRATION SURROUNDS A FIRST IMPURITY REGION AND METHOD FOR FORMING THE SAME, AND IMAGE SENSOR INCLUDING THE ISOLATION STRUCTURE AND METHOD FOR FABRICATING THE IMAGE SENSOR

CROSS-REFERENCE TO RELATED APPLICATIONS

The present application claims priority of Korean Patent Application Nos. 10-2013-0062477 and 10-2003-0062478, filed on May 31, 2013, which are incorporated herein by reference in their entirety.

BACKGROUND

1. Field

Exemplary implementations of the present invention relate to a semiconductor device fabrication technology, and more particularly, to an isolation structure and a method for forming the isolation structure, and an image sensor including the isolation structure and a method for fabricating the image sensor.

2. Description of the Related Art

An image sensor is a semiconductor device that transforms an optical image into electrical signals. Image sensors may be divided into a Charge Coupled Device (CCD) type and a Complementary Metal Oxide Semiconductor (CMOS) type. The CMOS-type image sensors are commonly abbreviated as "CIS." A CIS may include a plurality of pixels that are arrayed in two dimensions, and each pixel may be isolated by an isolation structure. Each pixel isolated by the isolation structure may include a photodiode (PD). The photodiode transforms incident light into electrical signals.

As semiconductor device fabrication technology progresses, a degree of integration of image sensors increases. A high degree of integration of image sensors requires that pixels be smaller. As a result, less space is allowed between the pixels. The reduction in space between the pixels may lead to deterioration in device characteristics because of the crosstalk between the pixels.

SUMMARY

An exemplary implementation isolation structure for isolating a plurality of device regions from each other may include a first isolation structure having an insulation layer formed in a trench in a substrate, and a second isolation structure, formed on the first isolation structure, the second isolation structure including a first impurity region formed in the substrate, the first impurity region having a first impurity doping concentration, and a second impurity region that is formed around the first impurity region, the second impurity region having a second impurity doping concentration that is greater than the first doping concentration.

An exemplary method of forming an isolation structure for isolating a plurality of device regions from each other may include etching a substrate to form a trench, forming an amorphous region in the substrate, the amorphous region defining a bottom of the trench, and the amorphous region having a melting temperature that is lower than a melting temperature of the substrate, implanting an impurity into the amorphous region to form an amorphous impurity region, and performing an annealing process on the amorphous impurity region to activate the impurity.

The exemplary method of forming an isolation structure may further include filling the trench with an insulation layer before the forming of the amorphous region or after the performing an annealing process, and performing, before the forming of the amorphous region, another annealing process to form a protruding portion on a backside of the substrate.

The forming of the amorphous region may further comprise performing a pre-amorphization process on the substrate.

The performing an annealing process to activate the impurity may further comprise performing a laser annealing process.

The performing a laser annealing process may comprise: irradiating a laser beam onto the amorphous impurity region for a certain time to melt the amorphous impurity region, and removing the laser beam from the amorphous impurity region to solidify the amorphous impurity region.

The implanting an impurity into the amorphous region may further comprise: implanting an impurity that is to function as a potential barrier between portions of the substrate corresponding to the device regions.

An exemplary image sensor may include a substrate, a plurality of photoelectric conversion regions formed in the substrate, wherein each of the photoelectric conversion regions corresponds to a pixel of in the image sensor, and an isolation structure formed in the substrate, between each of the plurality of photoelectric conversion regions, the isolation structure comprising a first isolation structure formed in a trench in the substrate, and a second isolation structure formed adjacent to the first isolation structure, the second isolation structure including a first impurity region formed in the substrate, the first impurity region having a first impurity doping concentration, and a second impurity region formed around the first impurity region, the second impurity region having a second impurity doping concentration that is greater than the first impurity doping concentration.

An exemplary method of forming an image sensor may include forming photoelectric conversion regions in a substrate, each of the photoelectric conversion regions corresponding to a pixel of the image sensor forming a trench in the substrate between each of the photoelectric conversion regions, forming an amorphous region in the substrate, wherein the amorphous region defines a bottom of the trench and has a melting temperature that is lower than a melting temperature of the substrate, implanting an impurity into the amorphous region to form an amorphous impurity region, and activating the impurity by melting the amorphous impurity region and recrystallizing the melted amorphous impurity region.

The exemplary method of forming an image sensor may further include: forming an insulation layer in the trench before the forming of the amorphous region or after the activating the impurity.

The insulation layer may have a refractive index that is less than a refractive index of the substrate and the photoelectric conversion regions.

The exemplary method of forming an image sensor may further include: performing, before the forming of the amorphous region, another annealing process to form a protruding portion on a backside of the substrate.

The activating the impurity may comprise: performing a laser annealing process.

The performing a laser annealing process may comprise: irradiating a laser beam onto the amorphous impurity region for a certain time to melt the amorphous impurity region, and removing the laser beam from the amorphous impurity region to solidify the amorphous impurity region.

The impurity may comprise a material that functions as a potential barrier between the photoelectric conversion regions, and that reduces a refractive index of the amorphous impurity region to be less than a refractive index of the substrate and the photoelectric conversion regions.

The impurity may be a metal having a conductivity type that is opposite to a conductivity type of the photoelectric conversion regions.

The exemplary method of forming an image sensor may further include: forming an interlayer dielectric layer on the substrate, and forming a passivation layer between the substrate and interlayer dielectric layer.

The passivation layer may have a thermal conductivity that is lower than a thermal conductivity of the substrate.

An exemplary image sensing device may include: an active pixel sensor array suitable for outputting pixel signals corresponding to incident light, a row driver suitable for driving a readout operation by simultaneously activating all of pixels in one row of the active pixel sensor array, a pixel signal processor suitable for receiving the pixel signals outputted from the active pixel sensor array to output digital signals by sampling the pixel signals, and a controller suitable for controlling the row driver and the pixel signal processor to perform a process suitable for the pixel signals, wherein the active pixel sensor array includes: a substrate, a plurality of photoelectric conversion regions formed in the substrate, wherein each of the photoelectric conversion regions corresponds to a pixel of in the active pixel sensor array, and an isolation structure formed in the substrate, between each of the plurality of photoelectric conversion regions, the isolation structure comprising: a first isolation structure formed in a trench in the substrate, and a second isolation structure formed adjacent to the first isolation structure, the second isolation structure including: a first impurity region formed in the substrate, the first impurity region having a first impurity doping concentration, and a second impurity region formed around the first impurity region, the second impurity region having a second impurity doping concentration that is greater than the first impurity doping concentration.

BRIEF DESCRIPTION OF THE DRAWINGS

FIG. 5A is a cross-sectional view illustrating an exemplary image sensor.
FIG. 5B is a cross-sectional view illustrating a modified exemplary image sensor.

DETAILED DESCRIPTION

Figure 1:
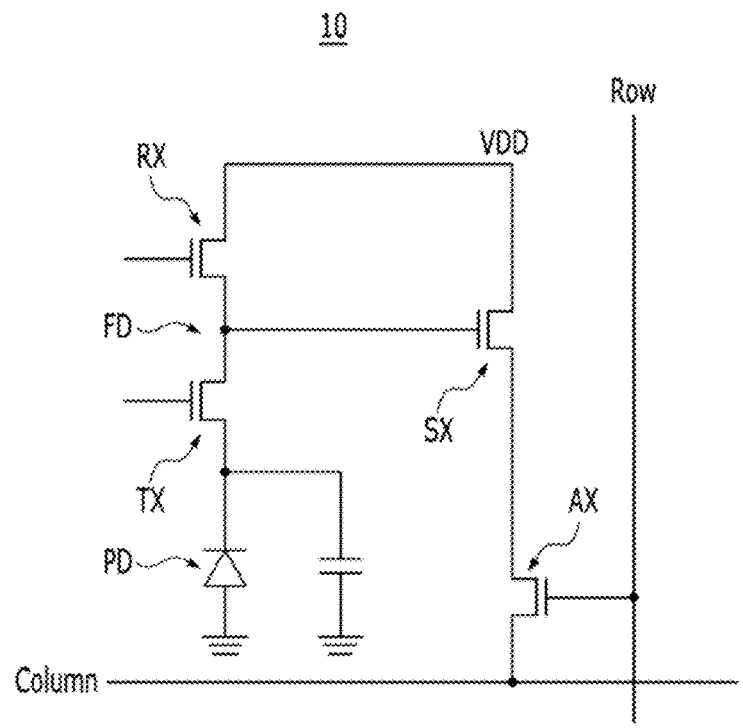
FIG. 1 is a circuit diagram of an exemplary image sensor.

Exemplary implementations of the present invention will be described below in more detail with reference to the accompanying drawings. The present invention may, however, be embodied in different forms and should not be construed as limited to the implementations set forth herein. Rather, these implementations are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the implementations. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

The following exemplary implementations provide an isolation structure that may prevent interference between neighboring device regions in a semiconductor device having a plurality of device regions, and provide a method of forming the isolation structure. Also, the exemplary implementations provide an image sensor employing an isolation structure that may prevent crosstalk between neighboring pixels in an image sensor having a plurality of pixels, and provide a method of fabricating the image sensor.

The exemplary implementations provide an isolation structure where a first isolation structure, including an insulation layer for filling trenches in a substrate, and a second isolation structure, including an impurity region that functions as a potential barrier for cutting off the transfer of electrical charges, are stacked, and provide a method of forming the isolation structure. Also, the exemplary implementations provide an image sensor employing the isolation structure, and provide a method of fabricating the image sensor.

Also, the exemplary implementations provide an isolation structure having a different refractive index from the substrate corresponding to pixels. To be specific, the exemplary implementations provide an isolation structure having a refractive index that is smaller than a refractive index of the substrate where pixels are disposed. To be more specific, the exemplary implementations provide an isolation structure that includes a first isolation structure having an insulation layer to fill trenches in a substrate. The isolation structure further includes a second isolation structure that includes an impurity region that functions as a potential barrier to cut off the transfer of electrical charges. The second isolation structure has a refractive index that is smaller than a refractive index of the substrate. The first isolation structure and the second isolation structure may be stacked. The exemplary implementations also provide a method of forming the isolation structure, an image sensor employing the isolation structure, and a method of fabricating the image sensor. Herein, the impurity region having a smaller refractive index than the substrate may be formed by doping the substrate with an impurity that reduces the refractive index than the substrate. The impurity region is formed to have a refractive index that is smaller than the refractive index of the substrate in order to induce total reflection. Also, the word "doping" means that the impurity implanted into the substrate is bonded with the material that constitutes the substrate.

As discussed above, image sensors may be divided into a Charge Coupled Device (CCD) type and a Complementary Metal Oxide Semiconductor (CMOS) type. The CMOS-type image sensors may further be divided into a Front-Side Illumination (FSI) type and a Back-Side Illumination (BSI). In the following exemplary implementations, an N-type BSI image sensor is described. However, the present invention is not limited to an N-type BSI image sensor, and may include any type of CCD or CMOS type image sensor.

FIG. 1 is a circuit diagram illustrating an exemplary image sensor.

Referring to FIG. 1, a photoelectric conversion region PD, a transfer transistor TX, a selection transistor SX, a reset transistor RX, and an access transistor AX may corresponds to each pixel of an image sensor 10. The photoelectric conversion region PD may include a plurality of photoelectric conversion units that vertically overlap each other. Each of the photoelectric conversion units may be a photodiode including an N-type impurity region and a P-type impurity region. Each transfer transistor TX may include a transfer gate that may be extended inside of a substrate. The transfer gate may be a recess gate, a saddle-fin gate, or a buried gate. A drain of each transfer transistor TX may be a floating diffusion region FD. The floating diffusion region FD may be a source of the reset transistor RX. The floating diffusion region FD may be electrically connected to a selection gate of the selection transistor SX. The selection transistor SX and the reset transistor RX may be connected in series. The selection transistor SX may be coupled with the access transistor AX. The reset transistor RX, the selection transistor SX, and the access transistor AX may be shared by neighboring pixels and in this way, integration of the image sensor may be improved.

Hereafter, the operation of the exemplary image sensor will be described with reference to FIG. 1. First of all, electrical charges remaining in the floating diffusion region FD are emitted by applying a power source voltage VDD to a drain of the reset transistor RX and a drain of the selection transistor SX while external light is cut off. Subsequently, when the reset transistor RX is turned off and the external light is irradiated to the photoelectric conversion region PD, electron-hole pairs are generated in the photoelectric conversion region PD. The generated holes move to a P-type impurity region to be accumulated therein, whereas the generated electrons move to an N-type impurity region to be accumulated therein. When the transfer transistor TX is turned on, electrical charges, such as the accumulated electrons and holes are transferred to the floating diffusion region FD to be accumulated therein. As a gate bias of the selection transistor SX is changed in proportion to the amount of the accumulated electrical charges, a potential of a source of the selection transistor SX is altered. Herein, when the access transistor AX is turned on, signals represented by the electrical charges are read.

Herein, as image sensors are integrated higher and higher, the size of pixels and the space between the pixels are decreased gradually, deteriorating the device characteristics due to the interference between neighboring pixels, in other words, crosstalk. In order to prevent the crosstalk, an isolation structure is formed over a substrate to isolate the pixels from each other.

The isolation structure may be an impurity region formed by ion-implanting an impurity, or an insulation region where an insulative material gap-fills the inside of the trenches that are already formed in the substrate. The impurity region may prevent the occurrence of electrical crosstalk by serving as a potential barrier for cutting off the transfer of electrical charges between the pixels. The impurity region, however, cannot substantially increase the integration of an isolation structure and causes deterioration in device characteristics due to the diffused impurity because physical crosstalk caused by incident light may not be prevented and it is hard to control the diffusion of an impurity in the process of forming the impurity region. On the other hand, the insulation region may improve integration degree and prevent physical and electrical crosstalk caused by incident light, which is advantageous, while the insulation region itself for isolation causes dark current to be generated from the numerous dangling bonds and defects on the surface, which is disadvantageous.

Therefore, the following implementations of the present invention provides an isolation structure that may prevent the generation of dark current, easily improve integration degree while preventing electrical crosstalk caused by the transfer of electrical charges and physical crosstalk caused by incident light, a method for forming the isolation structure, an image sensor employing the isolation structure, and a method for fabricating the image sensor.

Figure 2:
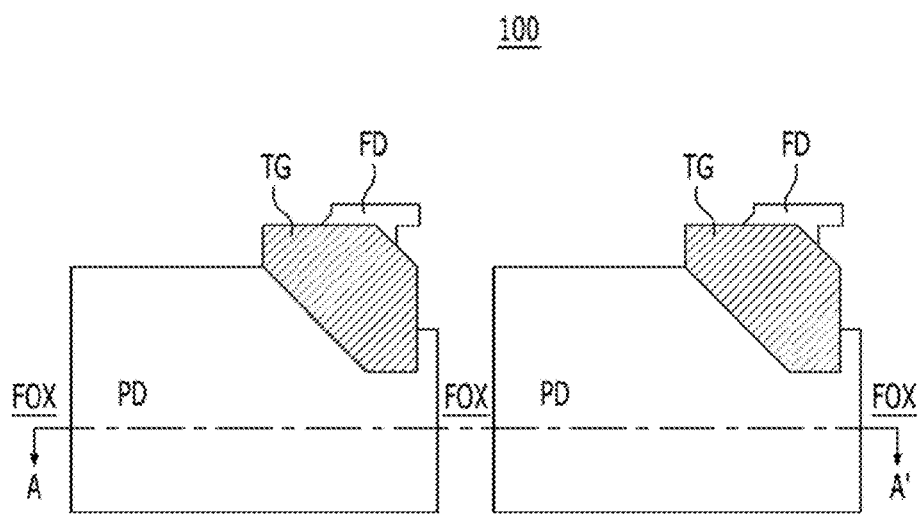
FIG. 2 shows plan views of exemplary image sensors.
Figure 3A:
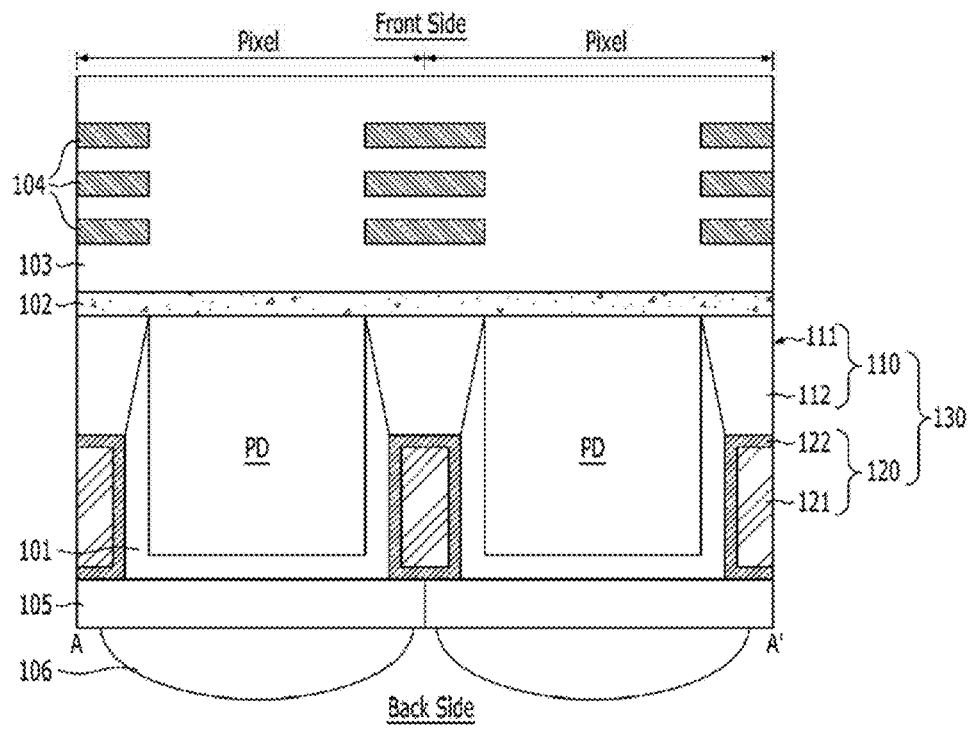
FIG. 3A is a cross-sectional view illustrating an exemplary image sensor
Figure 3B:
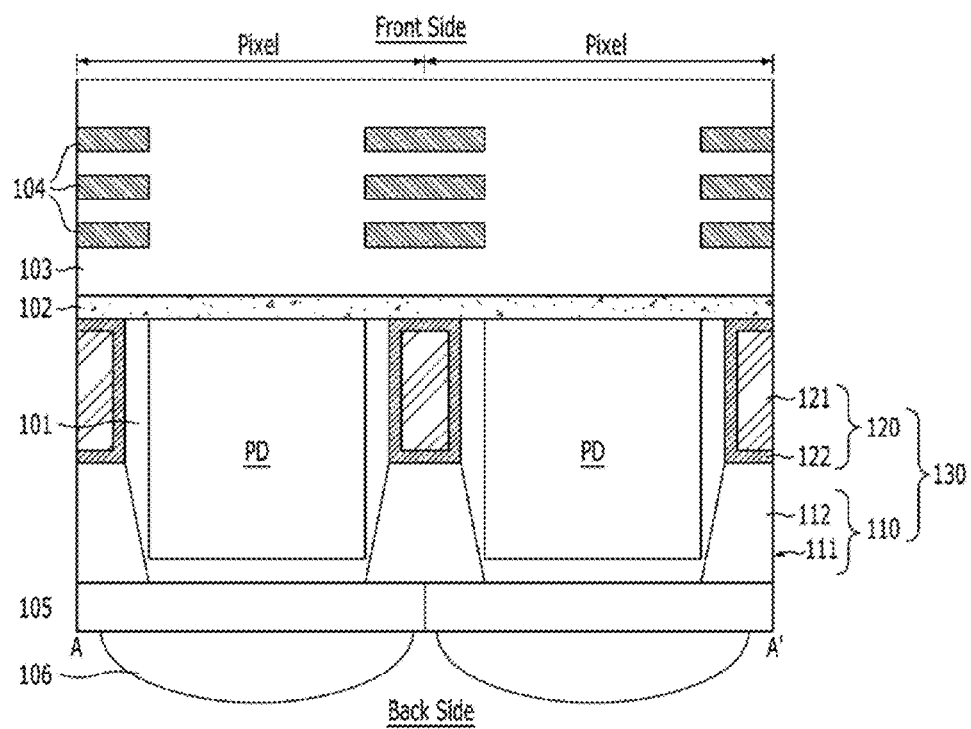
FIG. 3B is a cross-sectional view illustrating a modified exemplary image sensor.

FIG. 2 shows plan views of exemplary image sensors. FIGS. 3A and 3B are cross-sectional views of the image sensors shown in FIG. 2 taken by cutting the image sensors along a line A-A'. FIG. 3A is a cross-sectional view illustrating the exemplary image sensor. FIG. 3B is a cross-sectional view illustrating a modified exemplary image sensor.

As illustrated in FIGS. 2, 3A and 3B, the image sensor 100 may include an isolation structure 130 having a first isolation structure 110 and a second isolation structure 120 that are formed in a substrate 101 and that isolate a plurality of pixels from each other. The image sensor further includes photoelectric conversion regions PD that are formed in portions of the substrate 101 corresponding to the plurality of pixels. The substrate 101 may be a semiconductor substrate. The semiconductor substrate may be of a monocrystalline state and it may include a silicon-containing material. For example, the substrate 101 may include a monocrystalline silicon-containing material.

The photoelectric conversion regions PD may include a plurality of photoelectric conversion units that vertically overlap each other, and each of the photoelectric conversion units may be a photodiode including an N-type impurity region and a P-type impurity region. The photoelectric conversion regions PD and the isolation structures 130 may be separated by a certain distance.

The first isolation structure 110 may include an insulation layer 112 that fills a trench 111 in the substrate 101. The trench 111 may have substantially vertical sidewalls or slanted sidewalls. The form (or the slope) of the sidewalls of the trench 111 may be adjusted to control a path of incident light. The insulation layer 112 may be a single layer, such as an oxide layer, a nitride layer, or an oxy-nitride layer, or may be a stacked layer including two or more of an oxide layer, a nitride layer, or an oxy-nitride layer. For example, although not illustrated in the drawing, the insulation layer 112 may be a stacked layer including a sidewall oxide layer, formed on the sidewalls of the trench 111 through a thermal oxidation process, a liner nitride layer formed over the sidewall oxide layer, a liner oxide layer formed over the liner nitride layer, and a fluidic insulation layer (such as a Spin-On Dielectric (SOD) layer or a high-density plasma oxide (HDP)) layer to fill the trench 111 over the liner oxide layer. If the substrate 101 includes a silicon-containing material, then the insulation layer 112 may include a silicon oxynitride layer.

The second isolation structure 120 may include an impurity region 121 and 122 that serves as a potential barrier to the photoelectric conversion regions PD. The impurity region may be formed through an impurity ion implantation process and an annealing process. The implanted impurity may be accumulated along an outer boundary of the impurity region due to the characteristics of the annealing process.

In an alternative implementation, the second isolation structure 120 may have a refractive index that is smaller than a refractive index of the substrate 101, including the photoelectric conversion regions PD. The impurity region 121 and 122 may be formed to have a refractive index that is smaller than a refractive index of the substrate 101 by impurity doping the substrate 101 with a material that reduces the refractive index of the substrate. Also, since the impurity region may serve as a potential barrier to the photoelectric conversion regions PD, the impurity region may have a conductivity type that is opposite to the conductivity type of the photoelectric conversion regions PD.

For example, if the photoelectric conversion region PD has an N-type conductivity, then the impurity region 121 and 122 may have a P-type conductivity. Thus, the impurity region may be formed by doping the substrate 101 with a P-type impurity, such as a P-type metal having a refractive index that is lower than the refractive index of the material of the substrate 101. For example, if the substrate 101 includes a silicon-containing material, then the P-type metal may include, for example, silver (Ag), cobalt (Co), iron (Fe), or the like. Therefore, the P-type metal combined with substrate has a smaller refractive index than the silicon-containing material alone.

Alternatively, if the photoelectric conversion region PD has a P-type conductive, then the impurity region may have an N-type conductivity. The N-type impurity may include an N-type metal. For example, if the substrate 101 includes a silicon-containing material, then the N-type metal may include, for example, aluminum (Al), titanium (Ti) or the like. Therefore, the N-type metal combined with the substrate has a smaller refractive index than the silicon-containing material alone.

To be specific, the second isolation structure 120 may include a first impurity region 121, and a second impurity region 122 that is formed along an outer boundary of the first impurity region 121 and that has a higher impurity doping concentration than the first impurity region 121. Since the impurity doping concentration of the second impurity region 122 is higher than that of the first impurity region 121, electrical crosstalk may be effectively prevented by increasing the potential barrier at the outer boundary of the first impurity region 121. The first impurity region 121 and the second impurity region 122 may have the same conductivity type, and the first impurity region 121 and the second impurity region 122 may be simultaneously formed due to the characteristics of an annealing process. The conductivity type of the first impurity region 121 and the second impurity region 122 may be selected based on the conductivity type of a neighboring photoelectric conversion region PD. For example, if the photoelectric conversion region PD neighboring the second isolation structure 120 has an N-type conductivity, then the first impurity region 121 and the second impurity region 122 may have a P-type conductivity. Therefore, a potential barrier to the photoelectric conversion region PD may be formed.

Also, the first isolation structure 110 and the second isolation structure 120 of the isolation structure 130 may vertically overlap each other. To be specific, the first isolation structure 110 may be stacked over the second isolation structure 120 (refer to FIG. 3A), with respect to a backside of the substrate 101, or the second isolation structure 120 may be stacked over the first isolation structure 110 (refer to FIG. 3B), with respect to a backside of the substrate 101.

The isolation structure 130 of FIG. 3A, in which the first isolation structure 110 is stacked over the second isolation structure 120, with respect to a backside of the substrate 101, may be more effective at preventing crosstalk caused by incident light. The isolation structure 130 of FIG. 3B, in which the second isolation structure 120 is stacked over the first isolation structure 110, with respect to the backside of the substrate 101 may be more effective at preventing the generation of dark current. Therefore, the positions of the first isolation structure 110 and the second isolation structure 120 may be selected based on required device characteristics. Though it is not shown, the isolation structure 130 may have a depth that is deeper than a depth of the photoelectric conversion regions PD, with respect to a front side of the substrate 101. This is to more effectively prevent crosstalk, as well as improve the isolation characteristics between the neighboring pixels. For example, the isolation structure 130 may penetrate through the substrate 101.

The image sensor 100 may include an interlayer dielectric layer 103 formed on the front side of the substrate 101, a signal generation circuit (not shown) formed inside of the interlayer dielectric layer 103, and a passivation layer 102 formed between the substrate 101 and the interlayer dielectric layer 103. The signal generation circuit generates (or outputs) an electrical signal corresponding to the electrical charges generated in the photoelectric conversion regions PD. To be specific, the signal generation circuit may include a plurality of transistors and multiple layers of metal lines 104. As shown in FIG. 1, the transistors may include a transfer transistor TX, a reset transistor RX, a selection transistor SX, and an access transistor AX. The multiple layers of metal lines 104 may be electrically connected to the transistors through a plurality of contact plugs (not shown). The passivation layer 102 may protect the signal generation circuit, particularly, the metal lines 104, from being damaged during a subsequent process. The passivation layer 102 may include a layer of a material having a thermal conductivity that is lower than a thermal conductivity of the substrate 101. The passivation layer 102 may be a single layer or a stacked layer including the material layer having a lower thermal conductivity than a thermal conductivity of the substrate 101. For example, if the substrate 101 includes a silicon-containing material, then the passivation layer 102 may include a silicon-containing insulation layer and a metal-containing insulation layer. The silicon-containing insulation layer may include a silicon oxide layer $SiO_2$, and the metal-containing insulation layer may include a zirconium oxide layer $ZrO_2$.

The exemplary image sensor may include a color filter 105 on the backside of the substrate 101 and a micro-lens 106 formed over the color filter 105.

The exemplary image sensor may effectively prevent physical or electrical crosstalk between the neighboring pixels by having the isolation structure 130 where the first isolation structure 110 and the second isolation structure 120 vertically overlap each other.

Also, since the isolation structure 130 has a refractive index that is smaller than a refractive index of the substrate 101, the physical crosstalk between the neighboring pixels may be effectively prevented.

In addition, since the impurity doping concentration of the second impurity region 122 that surrounds the first impurity region 121 is higher than that of the first impurity region 121, electrical crosstalk may be prevented more effectively.

FIGS. 4A to 4E are cross-sectional views showing a method of fabricating the exemplary image sensor shown in FIG. 3A.

Figure 4A:
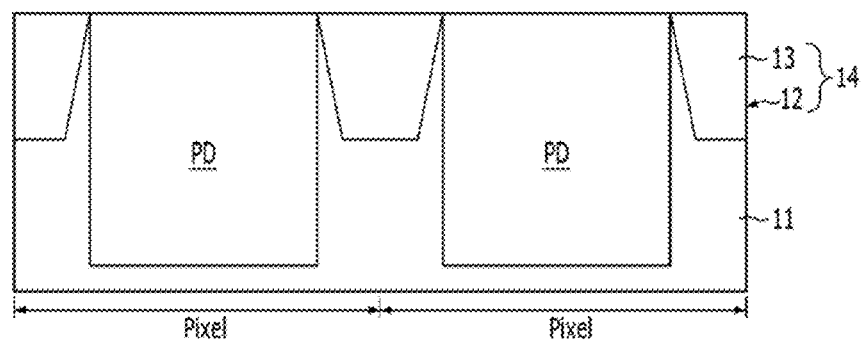
FIGS. 4A to 4E are cross-sectional views showing an exemplary method of fabricating the exemplary image sensor shown in FIG. 3A.

Referring to FIG. 4A, a substrate 11 where a plurality of pixels are defined is prepared. The substrate 11 may be a semiconductor substrate. The semiconductor substrate may be a monocrystalline semiconductor substrate and may include a silicon-containing material.

A trench 12 for forming a first isolation structure may be formed by selectively etching the substrate 11 in a region between adjacent pixels of the plurality of pixels. The trench 12 may have vertical sidewalls or slanted sidewalls to control the path of incident light. The etch process for forming the trench 12 may be a dry etch process.

An insulation layer 13 may be formed to fill the trenches 12. The insulation layer 13 may be formed by forming an insulation material over the substrate 11 to fill the trench 12 and planarizing the insulation material until a surface of the substrate 11 is exposed. The insulation layer 13 may be a single layer, such as, for example, an oxide layer, a nitride layer, or an oxynitride layer. Alternatively, the insulation layer 13 may be a stacked layer including two or more of the aforementioned layers. For example, although not illustrated in the drawing, the insulation layer 13 may be, for example, a stacked layer including a sidewall oxide layer, formed on the sidewalls of the trench 12 through a thermal oxidation process, a liner nitride layer formed over the sidewall oxide layer, a liner oxide layer formed over the liner nitride layer, and a fluidic insulation (such as a Spin-On Dielectric (SOD) layer or a high-density plasma oxide (HDP) layer) to fill the trench 12 over the liner oxide layer. Meanwhile, the insulation layer 13 may be a single layer selected from the group consisting of an oxide layer, a nitride layer, and an oxynitride layer, or a stacked layer where more than two of them are stacked, which has a refractive index smaller than the substrate 11. As a result, a first isolation structure 14, including the insulation layer 13 that fills the trench 12 formed in the substrate 11, may be formed.

Subsequently, photoelectric conversion regions PD are formed in the substrate 11 to correspond to the respective pixels. The photoelectric conversion regions PD may include a plurality of photoelectric conversion units that vertically overlap each other. Each of the photoelectric conversion units may be a photodiode including an N-type impurity region and a P-type impurity region. The photodiode may be formed through an impurity ion implantation process.

Figure 4B:
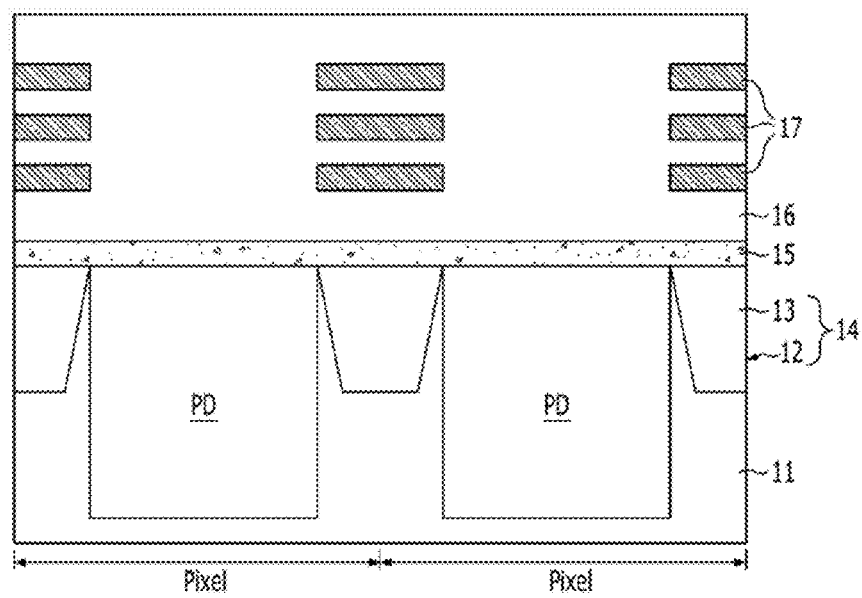

Referring to FIG. 4B, a passivation layer 15 may be formed over the substrate 11, including the first isolation structure 14 and the photoelectric conversion regions PD. The passivation layer 15 may be formed of a material having thermal conductivity that is lower than a thermal conductivity of the substrate 11. The passivation layer 15 may be a single layer or a stacked layer. For example, if the substrate 11 includes a silicon-containing material, then the passivation layer 15 may include, for example, a silicon-containing insulation layer or a metal-containing insulation layer. The silicon-containing insulation layer may include, for example, a silicon oxide layer $SiO_2$, and the metal-containing insulation layer may include a zirconium oxide layer $ZrO_2$.

An interlayer dielectric layer 16, including a signal generation circuit, may be formed over the passivation layer 15. The interlayer dielectric layer 16 may be, for example, an oxide layer, a nitride layer, or an oxynitride layer. The interlayer dielectric layer 16 may have a multi-layer structure. The signal generation circuit generates (or outputs) electrical signals corresponding to the electrical charges generated in the photoelectric conversion regions PD. The signal generation circuit may include a plurality of transistors and multiple layers of metal lines 17. The plurality of transistors may include (as shown in FIG. 1) a transfer transistor TX, a reset transistor RX, a selection transistor SX, and an access transistor AX. The multiple layers of metal lines 17 may be electrically connected to the plurality transistors through a plurality of contact plugs (not shown).

Although not illustrated in the drawings, a thickness of the substrate 11 may be decreased by performing a thinning process on the backside of the substrate 11 after the signal generation circuit is formed. This is to increase the light reception efficiency by reducing the distance that the incident light goes to enter the photoelectric conversion regions PD. The thinning process may be performed through a backgrinding and polishing.

Figure 4C:
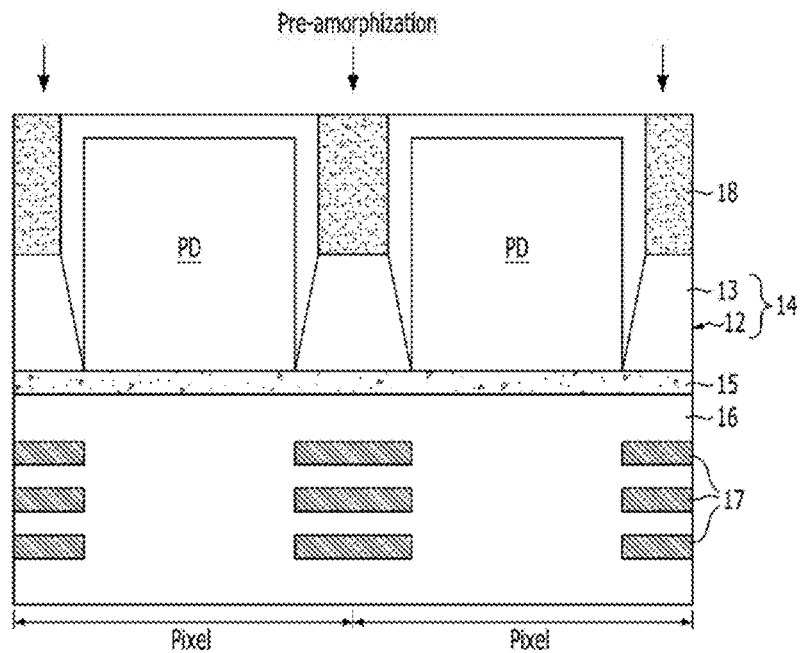

Referring to FIG. 4C, a mask pattern (not shown) may be formed on the backside of the substrate 11. The mask pattern may have an opening corresponding to the first isolation structure 14 to form a second isolation structure 22 (shown in FIG. 4E) in the substrate 11.

Subsequently, a pre-amorphization process for ion-implanting an impurity into the backside of the substrate 11 by using the mask pattern (not shown) as an ion implantation barrier is performed. If the substrate 11 is formed of a silicon-containing material, then the impurity for the pre-amorphization process may include, for example, germanium (Ge), silicon (Si), carbon (C) or the like. Through the pre-amorphization process, an amorphous region 18 may be formed in the substrate 11 to have its bottom surface contact the first isolation structure 14.

The amorphous region 18 may have a melting temperature that is lower than a melting temperature of the substrate 11. In an exemplary implementation, the amorphous region 18 may have a melting temperature that is about 200° C. lower than a melting temperature of a monocrystalline silicon substrate.

Figure 4D:
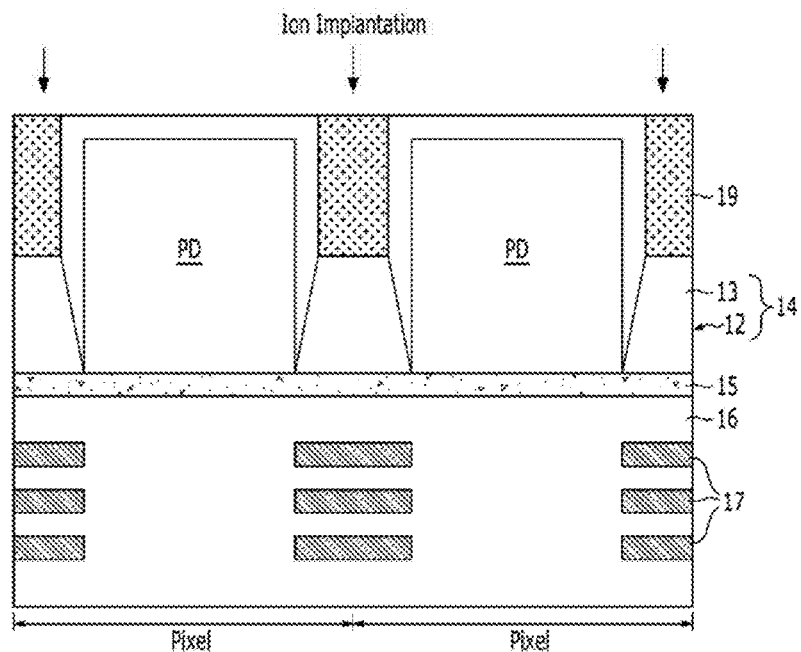

Referring to FIG. 4D, an impurity that may function as a potential barrier to the photoelectric conversion regions PD is ion-implanted into the amorphous region 18 by using the mask pattern (not shown) as an ion implantation barrier to form an amorphous impurity region 19.

The impurity that may form a potential barrier may have a conductivity type that is opposite to the conductivity type of a neighboring photoelectric conversion region PD. For example, if the neighboring photoelectric conversion region PD has an N-type conductivity, then the amorphous impurity region 19 may have a P-type impurity, such as boron (B).

According to an exemplary implementation, the impurity may have a refractive index that is smaller than a refractive index of the substrate 11, including the photoelectric conversion regions PD. The impurity may include, for example, a metal. For example, if the neighboring photoelectric conversion region PD has an N-type conductivity, then the amorphous impurity region 19 may have a P-type impurity, such as a P-type metal.

Figure 4E:
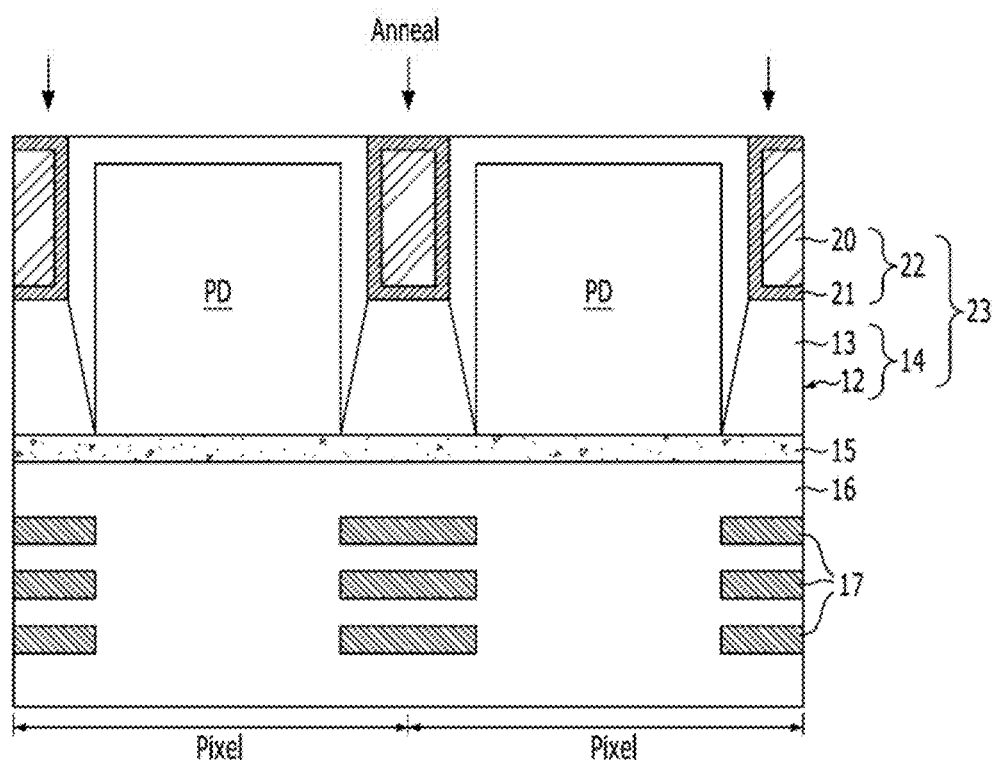

Referring to FIG. 4E, an annealing process is performed to recrystallize the amorphous impurity region 19 and to activate the impurity implanted into the amorphous impurity region 19. The annealing process is selectively performed only on the amorphous impurity region 19 to prevent deterioration in characteristics that may occur due to the diffusion of the implanted impurity and to reduce a thermal burden applied to the structures that are already formed. To this end, the annealing process may be a laser annealing that may be performed locally.

During the laser annealing process, a laser beam is irradiated onto the amorphous impurity region 19 for a predetermined time, so that the amorphous impurity region 19, which as a lower melting temperature than the monocrystalline substrate 11, is melted. When the molten amorphous impurity region 19 solidifies, it recrystallizes into a monocrystalline state and the implanted impurity is activated. Since the melting temperature of the substrate is higher than the melting temperature of the amorphous impurity region 19, the laser beam does not melt the substrate 11. Thus, by using an amorphous impurity region 19 having a lower melting temperature than the monocrystalline substrate 11, selective melting of the amorphous impurity region 19 may be achieved.

As a result, a second isolation structure 22 may be formed. The second isolation structure 22 may include a first impurity region 20 and a second impurity region 21. The second impurity region 22 may have an impurity doping concentration that is greater than an impurity doping concentration of the first impurity region 20. Since the amorphous impurity region 19 is melted during the annealing process, quality recrystallization may be carried out and the activation rate of the implanted impurity may be improved. Also, since the impurity implanted into the boundary region is accumulated during the recrystallization process, the second isolation structure 22, including the first impurity region 20 and the second impurity region 21, may be formed easily.

Meanwhile, during the annealing process, the passivation layer, which includes a material layer having a thermal conductivity that is lower than a thermal conductivity of the substrate 11, may protect the pre-formed signal generation circuit, particularly, the multiple layers of metal line 17, from being damaged.

Subsequently, as shown in FIGS. 3A and 3B, a conventional color filter 105 and a conventional micro-lens 106 may be formed on the backside of the substrate 11.

FIGS. 5A and 5B are cross-sectional views of the image sensors shown in FIG. 2 taken by cutting the image sensors along a line A-A'. FIG. 5A is a cross-sectional view illustrating an exemplary image sensor. FIG. 5B is a cross-sectional view illustrating a modification to the exemplary image sensor of FIG. 5A.

As illustrated in FIGS. 2, 5A and 5B, the image sensor may include an isolation structure 230 having a first isolation structure 210 and a second isolation structure 220 that are formed in a substrate 201 and that isolate a plurality of pixels from each other. The image sensor further includes photoelectric conversion regions PD that are formed in portions of the substrate 201 corresponding to the plurality of pixels. The substrate 201 may be a semiconductor substrate.

The semiconductor substrate 201 may be a monocrystalline substrate and may include a monocrystalline silicon-containing material.

The photoelectric conversion regions PD may include a plurality of photoelectric conversion units that vertically overlap each other, and each of the photoelectric conversion units may be a photodiode including an N-type impurity region and a P-type impurity region. The photoelectric conversion regions PD and the isolation structures 230 may be separated by a certain distance.

The first isolation structure 210 may include an insulation layer 212 that fills a trench 211 in the substrate 201. The trench 211 may have substantially vertical sidewalls or slanted sidewalls. The form (or the slope) of the sidewalls of the trench 211 may be adjusted to control a path of incident light. The insulation layer 212 may be a single layer, such as an oxide layer, a nitride layer, or an oxy-nitride layer, or may be a stacked layer including two or more of an oxide layer, a nitride layer, or an oxy-nitride layer. For example, although not illustrated in the drawing, the insulation layer 212 may be a stacked layer including a sidewall oxide layer, formed on the sidewalls of the trench 211 through a thermal oxidation process, a liner nitride layer formed over the sidewall oxide layer, a liner oxide layer formed over the liner nitride layer, and a fluidic insulation layer (such as a Spin-On Dielectric (SOD) layer or a high-density plasma oxide (HDP)) layer to fill the trench 211 over the liner oxide layer. If the substrate 201 includes a silicon-containing material, then the insulation layer 212 may include a silicon oxynitride layer.

The second isolation structure 220 may include an impurity region 221, 222 and 223 that serves as a potential barrier to the photoelectric conversion regions PD. The impurity region may be formed through an impurity ion implantation process and an annealing process. The implanted impurity may be accumulated over an outer boundary of the impurity region due to the characteristics of the annealing process.

In an alternative implementation, the second isolation structure 220 may have a refractive index that is smaller than a refractive index of the substrate 201, including the photoelectric conversion regions PD. The impurity region 221, 222 and 223 may be formed to have a refractive index that is smaller than a refractive index of the substrate 101 by impurity doping the substrate 101 with a material that reduces the refractive index of the substrate. Also, since the impurity region may serve as a potential barrier to the photoelectric conversion regions PD, the impurity region may have a conductivity type that is opposite to the conductivity type of the photoelectric conversion regions PD.

For example, if the photoelectric conversion region PD has an N-type conductivity, then the impurity region 221, 222 and 223 may have a P-type conductivity. Thus, the impurity region may be formed by doping the substrate 201 with a P-type impurity, such as a P-type metal having a refractive index that is lower than the refractive index of the material of the substrate 201. For example, if the substrate 201 includes a silicon-containing material, then the P-type metal may include, for example, silver (Ag), cobalt (Co), iron (Fe), or the like. Therefore, the P-type metal combined with substrate has a smaller refractive index than the silicon-containing material alone.

Alternatively, if the photoelectric conversion region PD has a P-type conductive, then the impurity region may have an N-type conductivity. The N-type impurity may include an N-type metal. For example, if the substrate 201 includes a silicon-containing material, then the N-type metal may include, for example, aluminum (Al), titanium (Ti) or the like. Therefore, the N-type metal combined with the substrate has a smaller refractive index than the silicon-containing material alone.

To be specific, the second isolation structure 220 may include a first impurity region 221, a second impurity region 222 that is formed along an outer boundary of the first impurity region 221 and that has a higher impurity doping concentration than the first impurity region 221, and a third impurity region 223 extending to an interface between the substrate 201 and the first isolation structure 210. Since the impurity doping concentration of the second impurity region 222 may be higher than that of the first impurity region 221, electrical crosstalk may be effectively prevented by increasing the size of the potential barrier at a boundary of the first impurity region 221. The third impurity region 223, which is formed between the substrate 201 and the first isolation structure 210, may prevent dangling bonds and defects between the substrate 201 and the first isolation structure 210, thereby suppressing a generation of dark current. The first impurity region 221 and the second impurity region 222 may have the same conductivity type. The third impurity region 223 may have the same conductivity type as the first impurity region 221 and the second impurity region 222. Alternatively, the third impurity region 223 may have a conductivity type that is different than the conductivity type of first impurity region 221 and the second impurity region 222. The conductivity types of the first to third impurity regions 221 to 223 may be selected based on the conductivity type of a neighboring photoelectric conversion region PD.

Further, the first isolation structure 210 and the second isolation structure 220 of the isolation structure 230 may vertically overlap each other. To be specific, the first isolation structure 210 may be stacked over the second isolation structure 220 (refer to FIG. 5B), with respect to a backside of the substrate 201, or the second isolation structure 220 may be stacked over the first isolation structure 210 (refer to FIG. 5B), with respect to the backside of the substrate 201.

The isolation structure 230 of FIG. 3A, in which the first isolation structure 210 is stacked over the second isolation structure 220, with respect to the backside of the substrate 201, may be more effective at preventing crosstalk caused by incident light.

The isolation structure 130 of FIG. 3B, in which the second isolation structure 220 is stacked over the first isolation structure 210, with respect to the backside of the substrate 201 may be more effective at preventing the generation of dark current. Therefore, the positions of the first isolation structure 210 and the second isolation structure 220 may be selected based on required device characteristics. Though it is not illustrated, the isolation structure 230 may have a depth that is deeper than a depth of the photoelectric conversion regions PD, with respect to a front side of the substrate 201. This is to more effectively prevent crosstalk, as well as improve the isolation characteristics between the neighboring pixels. For example, the isolation structure 230 may penetrate through the substrate 201.

The image sensor may include an interlayer dielectric layer 203 formed on the front side of the substrate 201, a signal generation circuit (not shown) formed inside of the interlayer dielectric layer 203, and a passivation layer 202 formed between the substrate 201 and the interlayer dielectric layer 203. The signal generation circuit generates (or outputs) electrical signals corresponding to the electrical charges generated in the photoelectric conversion regions PD. To be specific, the signal generation circuit may include a plurality of transistors and multiple layers of metal lines 204. As shown in FIG. 1, the transistors may include a transfer transistor TX, a reset transistor RX, a selection transistor SX, and an access transistor AX. The multiple layers of metal lines 204 may be electrically connected to the transistors through a plurality of contact plugs (not shown). The passivation layer 202 may protect the signal generation circuit, particularly, the metal lines 204, from being damaged during a subsequent process. The passivation layer 202 may include a layer of a material having a thermal conductivity that is lower than a thermal conductivity the substrate 201. The passivation layer 202 may be a single layer or a stacked layer including the material layer having a thermal conductivity that is lower than the thermal conductivity of the substrate 201. For example, if the substrate 201 includes a silicon-containing material, then the passivation layer 202 may include a silicon-containing insulation layer and a metal-containing insulation layer. The silicon-containing insulation layer may include a silicon oxide layer $SiO_2$, and the metal-containing insulation layer may include a zirconium oxide layer $ZrO_2$.

The exemplary image sensor may include a color filter 205 on the backside of the substrate 201 and a micro-lens 206 formed over the color filter 205.

The exemplary image sensor may effectively prevent physical or electrical crosstalk between the neighboring pixels by having the isolation structure 230 where the first isolation structure 210 and the second isolation structure 220 vertically overlap each other.

Also, since the isolation structure 230 has a refractive index that is smaller than a refractive index of the substrate 201, the physical crosstalk between the neighboring pixels may be more effectively prevented.

In addition, since the impurity doping concentration of the second impurity region 222 that surrounds the first impurity region 221 is higher than the first impurity region 221, electrical crosstalk may be prevented more effectively.

Furthermore, since the third impurity region 223 extends to an interface between the substrate 201 and the first isolation structure 210 is provided, dark current may be suppressed.

FIGS. 6A to 6E are cross-sectional views showing a method of fabricating the exemplary image sensor shown in FIG. 5A.

Figure 6A:
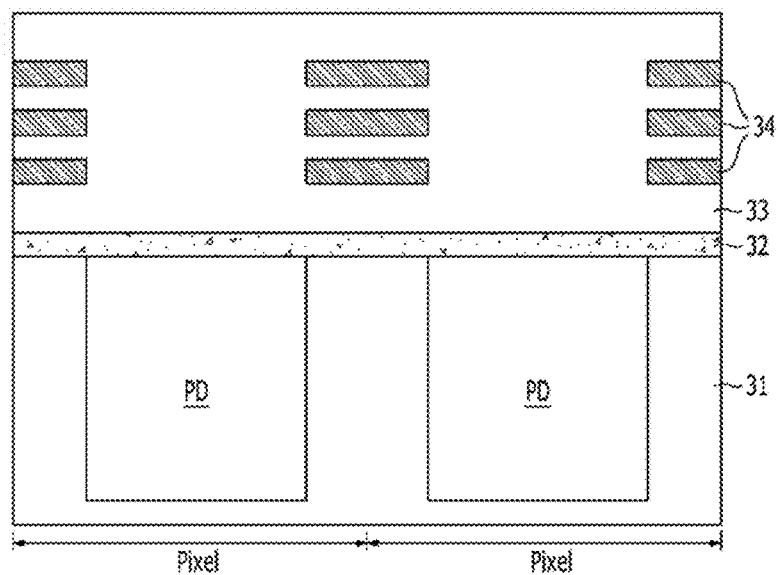
FIGS. 6A to 6E are cross-sectional views showing an exemplary method of fabricating the exemplary image sensor shown in FIG. 5A.
Figure 6B:
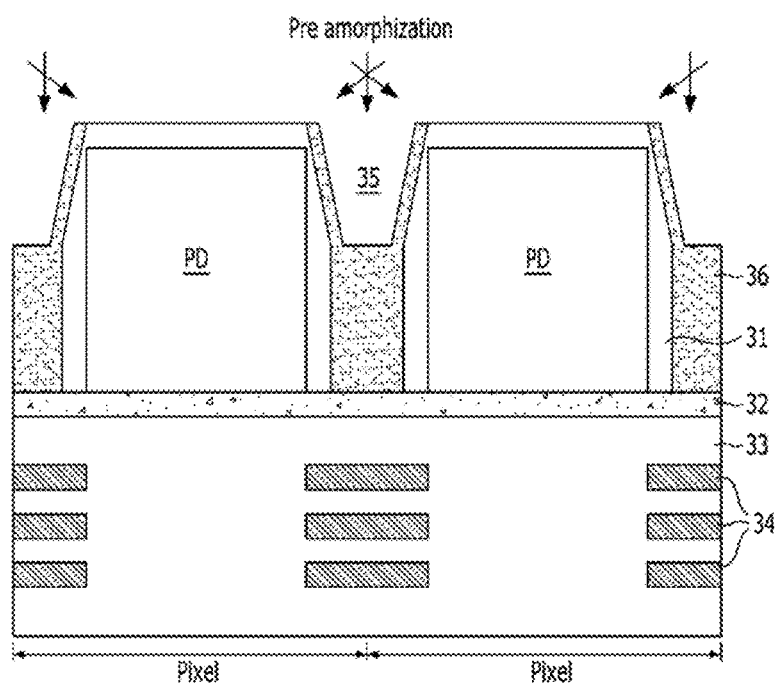

Referring to FIG. 6A, a substrate 31 where a plurality of pixels are defined is prepared. The substrate 31 may be a semiconductor substrate. The semiconductor substrate may be a monocrystalline semiconductor substrate and may include a silicon-containing material.

Photoelectric conversion regions PD are formed in the substrate 31 to correspond to the respective pixels. The photoelectric conversion regions PD may include a plurality of photoelectric conversion units that vertically overlap each other. Each of the photoelectric conversion units may be a photodiode including an N-type impurity region and a P-type impurity region. The photodiode may be formed through an impurity ion implantation process.

A passivation layer 32 may be formed over the substrate 31, including the photoelectric conversion regions PD. The passivation layer 32 may be formed of a material having a thermal conductivity that is lower than a thermal conductivity of the substrate 31. The passivation layer 32 may be a single layer or a stacked layer. For example, if the substrate 31 includes a silicon-containing material, then the passivation layer 32 may include, for example, a silicon-containing insulation layer or a metal-containing insulation layer. The silicon-containing insulation layer may include a silicon oxide layer $SiO_2$, and the metal-containing insulation layer may include a zirconium oxide layer $ZrO_2$.

An interlayer dielectric layer 33, including a signal generation circuit, may be formed over the passivation layer 32. The interlayer dielectric layer 33 may be, for example, an oxide layer, a nitride layer, or an oxynitride layer. The interlayer dielectric layer 33 may have a multi-layer structure. The signal generation circuit generates (or outputs) electrical signals corresponding to the electrical charges generated in the photoelectric conversion regions PD. The signal generation circuit may include (as shown in FIG. 1) a plurality of transistors and multiple layers of metal lines 34. The transistors may include a transfer transistor TX, a reset transistor RX, a selection transistor SX, and an access transistor AX. The multiple layers of metal lines 34 may be electrically connected to the plurality of transistors through a plurality of contact plugs (not shown).

Referring to 6B, a mask pattern (not shown) may be formed on the backside of the substrate 31. The mask pattern may have an opening corresponding to where a first isolation structure will be formed in the substrate 31.

A trench 35 for forming a first isolation structure may be formed by selectively etching the substrate 31 by using the mask pattern (not shown) as an etch barrier. The trench 35 may have vertical sidewalls or slanted sidewalls to control the path of incident light. The etch process for forming the trench 35 may be a dry etch process.

Subsequently, a pre-amorphization process for ion-implanting an impurity into the backside of the substrate 31 by using the mask pattern (not shown) as an ion implantation barrier is performed. The pre-amorphization process may be performed several times by changing an ion-implanting injection angle of the impurity. If the substrate 31 is formed of a silicon-containing material, then impurity for the pre-amorphization process may include germanium (Ge), silicon (Si), carbon (C) or the like. Through the pre-amorphization process, an amorphous region 36 may be formed in the substrate 31. The amorphous region 36 may be formed to have a generally pillar-type configuration, whose top surface forms a bottom of the trench 35, and whose bottom surface contacts the passivation layer 32. Further, the amorphous region 36 may be formed along the substrate 31 to define sidewalls of the trench 35.

The amorphous region 36 may have a melting temperature that is lower than a melting temperature of the substrate 31. In an exemplary implementation, the amorphous region 36 may have a melting temperature that is about 200° C. lower than a melting temperature of a monocrystalline silicon substrate.

Although not illustrated in the drawings, a thickness of the substrate 31 may be decreased by performing a thinning process on the backside of the substrate 31 after the signal generation circuit is formed. This is to increase the light reception efficiency by reducing the distance that the incident light goes to enter the photoelectric conversion regions PD. The thinning process may be performed through a backgrinding and polishing.

Figure 6C:
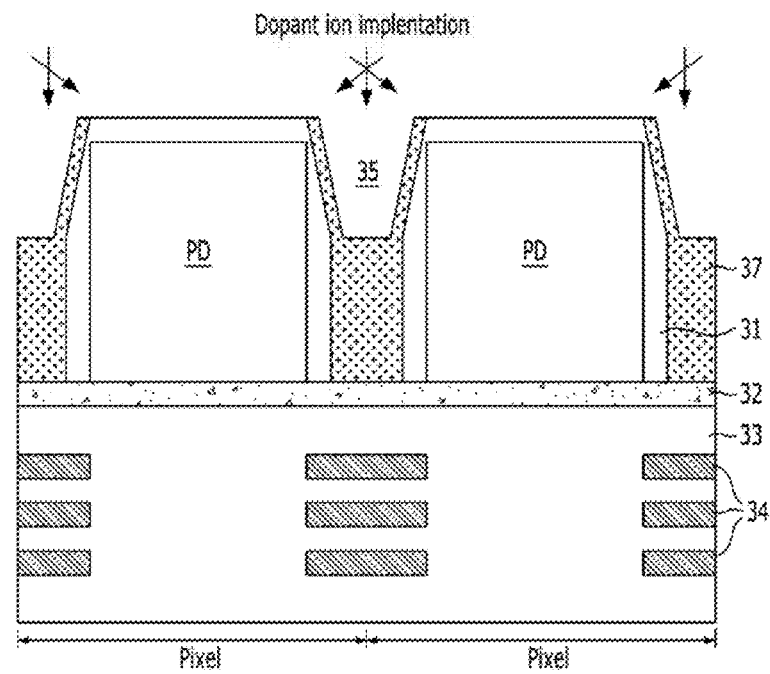

Referring to FIG. 6C, an impurity that may function as a potential barrier to the photoelectric conversion regions PD is ion-implanted into the amorphous region 36 by using the mask pattern (not shown) as an ion implantation barrier to form an amorphous impurity region 37.

The impurity that may form a potential barrier may have a conductivity type that is opposite to the conductivity type of a neighboring photoelectric conversion region PD. For example, if the neighboring photoelectric conversion region PD has an N-type conductivity, then the amorphous impurity region 37 may have a P-type impurity, such as boron (B).

According to an exemplary implementation, the impurity may have a refractive index that is smaller than a refractive index of the substrate 31, including the photoelectric conversion regions PD. The impurity may include, for example, a metal. For example, if the neighboring photoelectric conversion region PD has an N-type conductivity, then the amorphous impurity region 37 may have a P-type impurity, such as a P-type metal.

Figure 6D:
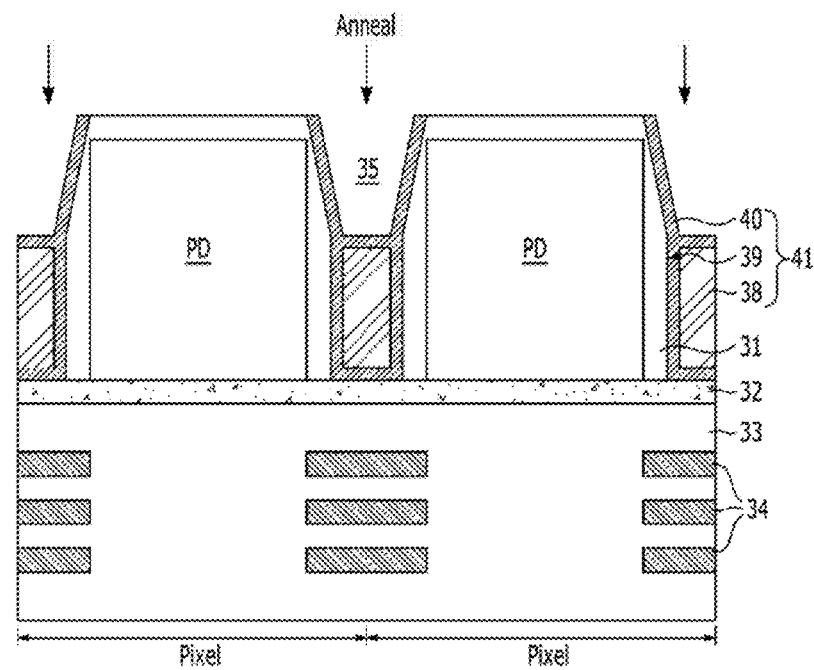
Figure 6E:
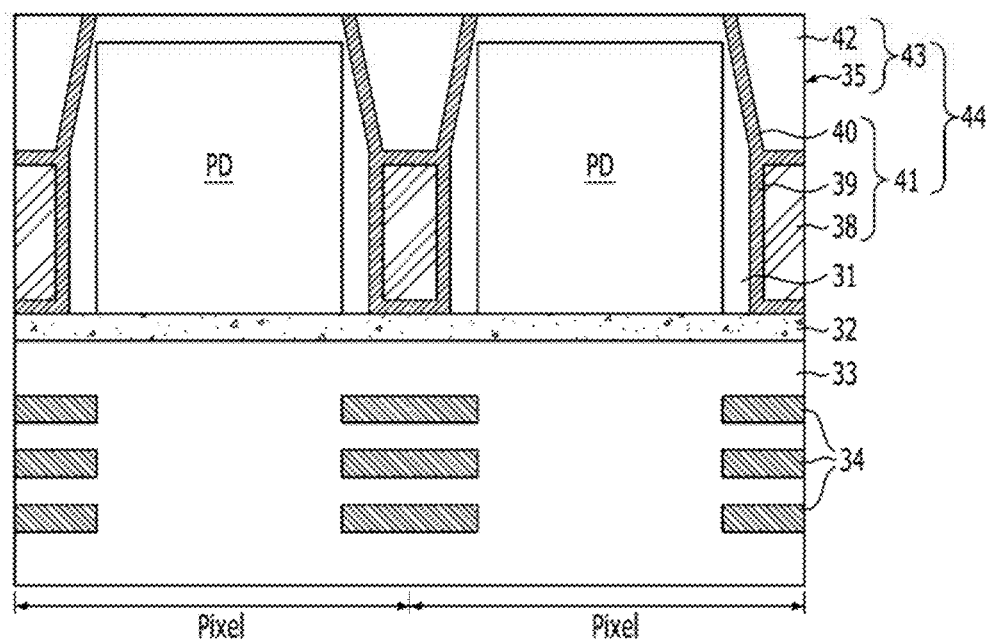

Referring to FIG. 6D, an annealing process may be performed to activate the impurity implanted into the amorphous impurity region 37 and to recrystallize the amorphous impurity region 37. The annealing process is selectively performed only on the amorphous impurity region 37 to prevent deterioration in characteristics that may occur due to the diffusion of the implanted impurity and to reduce thermal burden applied to the structures that are already formed. To this end, the annealing process may be a laser annealing that may be performed locally.

During the laser annealing process, a laser beam is irradiated onto the amorphous impurity region 37 for a predetermined time, so that the amorphous impurity region 37, which as a lower melting temperature than the monocrystalline substrate 31, is melted. When the molten amorphous impurity region 37 solidifies, it crystallizes into a monocrystalline state and the implanted impurity is activated. Since the melting temperature of the substrate is higher than the melting temperature of the amorphous impurity region 37, the laser beam does not melt the substrate 31. Thus, by using an amorphous impurity region 37 having a lower melting temperature than the monocrystalline substrate 31, selective melting of the amorphous impurity region 37 may be achieved.

As a result, a second isolation structure 41 may be formed. The second isolation structure 22 may include a first impurity region 38, a second impurity region 39, and a third impurity region 40. The second impurity region 39 may have an impurity doping concentration that is greater than an impurity doping concentration of the first impurity region 38. Since the amorphous impurity region 37 is melted during the annealing process, quality recrystallization may be carried out and the activation rate of the implanted impurity may be improved. Also, since the impurity implanted into the boundary region is accumulated during the recrystallization process, the second isolation structure 41 including the first to third impurity regions 38 to 40 may be formed easily. The third impurity region 40 may prevent dangling bonds and defects over the trench 35, thereby suppressing a generation of dark current. Meanwhile, during the annealing process, the passivation layer 32, which includes a material layer having a thermal conductivity that is lower than a thermal conductivity of the substrate 31, may protect the pre-formed signal generation circuit, particularly, the multiple layers of metal line 34, from being damaged.

Referring to 6E, an insulation layer 42 may be formed to fill the trench 35. The insulation layer 42 may be formed by forming an insulation material over the substrate 31 to fill the trench 35 and planarizing the insulation material until the surface of the substrate 31 is exposed. The insulation layer 42 may be a single layer, such as, for example, an oxide layer, a nitride layer, or an oxynitride layer. Alternatively, the insulation layer 42 may be a stacked layer including two or more of the aforementioned layers. For example, although not illustrated in the drawing, the insulation layer 42 may be, for example, a stacked layer including a sidewall oxide layer, formed on the sidewalls of the trench 35 through a thermal oxidation process, a liner nitride layer formed over the sidewall oxide layer, a liner oxide layer formed over the liner nitride layer, and a fluidic insulation (such as a Spin-On Dielectric (SOD) layer or a high-density plasma oxide (HDP) layer) to fill the trench 35 over the liner oxide layer. The insulation layer 42 may have a refractive index that is smaller than a refractive index of the substrate 31.

Meanwhile, the insulation layer 42 may be a single layer selected from the group consisting of an oxide layer, a nitride layer, and an oxynitride layer, or a stacked layer where more than two of them are stacked, which has a smaller refractive index than the substrate 11 that corresponds to the pixels.

As a result, a first isolation structure 43, which includes the insulation layer 42 that fills the trench 35 formed in the substrate 31, may be formed. Further, an isolation structure 44, including the first isolation structure 43 and the second isolation structure 41 vertically overlapping each other, may be formed.

Subsequently, as shown in FIGS. 5A and 5B, a conventional color filter 205 and a conventional micro-lens 206 may be formed on the backside of the substrate 31.

With the isolation structure 44 where the first isolation structure 43 and the second isolation structure 41 vertically overlap each other, the image sensor formed through the above-described fabrication process may effectively prevent physical or electrical crosstalk between neighboring pixels.

Also, since the isolation structure 44 has a smaller refractive index than does the substrate 31, the isolation structure 44 may effectively prevent the physical crosstalk between the neighboring pixels.

Also, since the impurity doping concentration of the second impurity region 39, which surrounds the first impurity region 38, is greater than the impurity doping concentration of the first impurity region 38, the second isolation structure 41 may effectively prevent the electrical crosstalk.

Furthermore, due to the third impurity region 40 of the second isolation structure 41, dark current may be suppressed more effectively.

Moreover, through the annealing process where the amorphous region 37, which has a melting temperature that is lower than the melting temperature of the monocrystalline-state substrate 31, is selectively melted, it is possible to prevent the deterioration in characteristics caused by the diffusion of the implanted impurity and alleviate the thermal burden applied to the structures that are already formed.

Figure 7A:
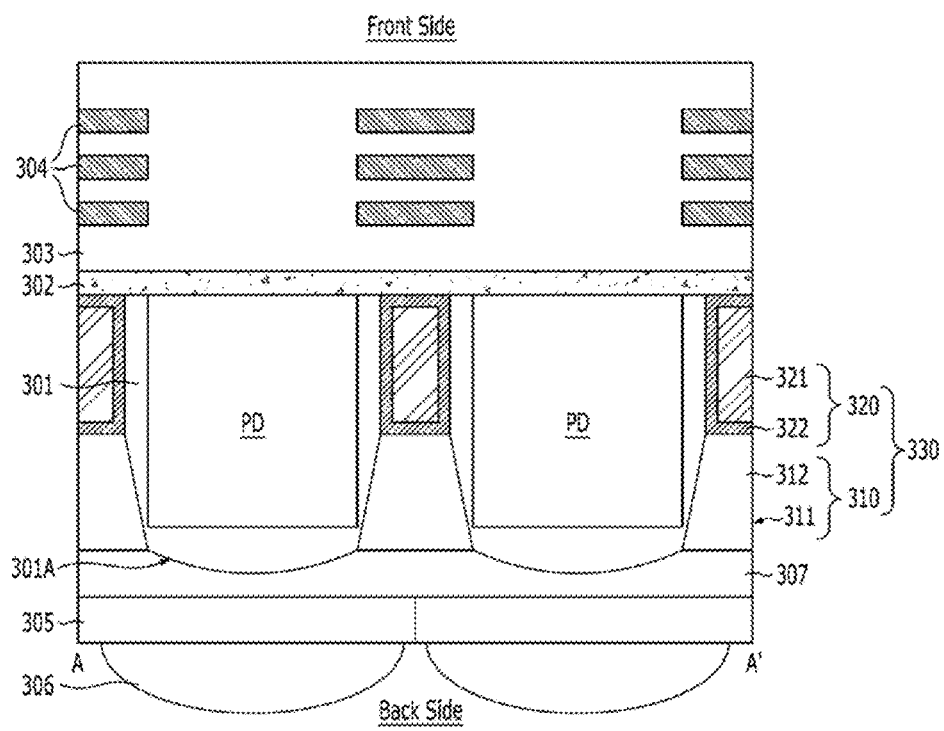
FIG. 7A is a cross-sectional view illustrating an exemplary image sensor.
Figure 7B:
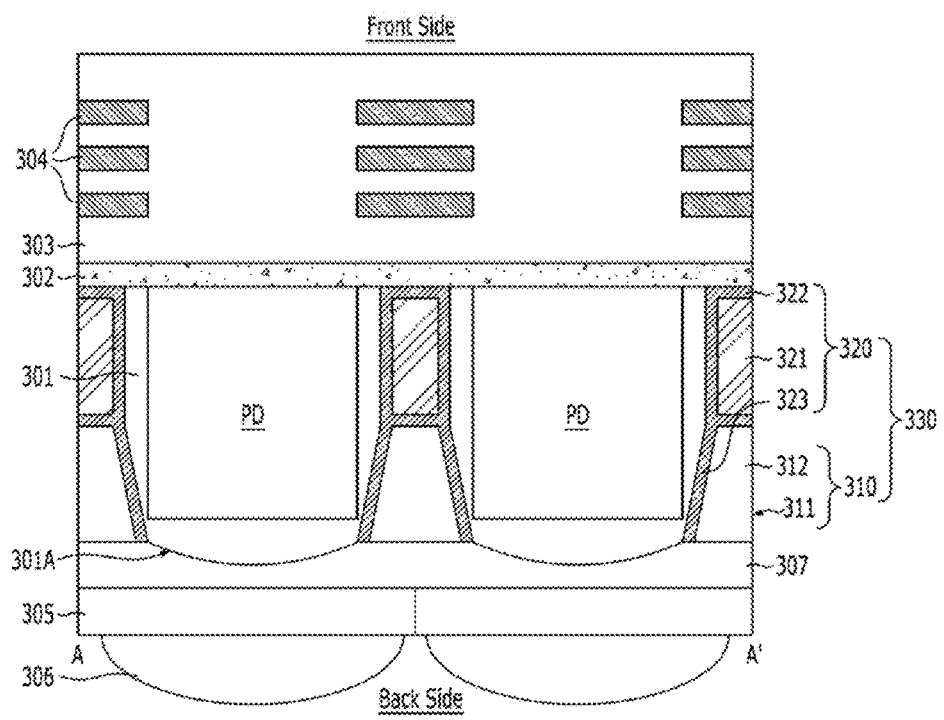
FIG. 7B is a cross-sectional view illustrating a modified exemplary image sensor.

FIGS. 7A and 7B are cross-sectional views of the image sensors shown in FIG. 2 taken by cutting the image sensors along a line A-A'. FIG. 7A is a cross-sectional view illustrating an exemplary image sensor. FIG. 7B is a cross-sectional view illustrating a modification to the exemplary image sensor if FIG. 7A.

As illustrated in FIGS. 2, 7A and 7B, the image sensor may include a substrate 301 that has a plurality of pixels isolated by an isolation structure 330 and a protruding surface 301A protruding above each pixel. The isolation structure 330 may include a first isolation structure 310 and a second isolation structure 320. The image sensor further includes photoelectric conversion regions PD that are formed in portions of the substrate 301 corresponding to the plurality of pixels. The protruding surface 301A has a curvature that may improve an ability to focus incident light onto the photoelectric conversion regions PD. The substrate 301 may be a semiconductor substrate. The semiconductor substrate may be a monocrystalline substrate and may include a silicon-containing material. For example, the protruding surface 301A having the curvature may be formed to have a convex type protruding from the backside of the substrate 301.

The photoelectric conversion regions PD may include a plurality of photoelectric conversion units that vertically overlap each other, and each of the photoelectric conversion units may be a photodiode including an N-type impurity region and a P-type impurity region. The photoelectric conversion regions PD and the isolation structures 330 may be separated by a certain distance.

The first isolation structure 310 may include an insulation layer 312 that fills a trench 311 in the substrate 301. The trench 311 may have substantially vertical sidewalls or slanted sidewalls. The form (or the slope) of the sidewalls of the trench 311 may be adjusted to control a path of incident light. The insulation layer 312 may be a single layer, such as an oxide layer, a nitride layer, or an oxy-nitride layer, or may be a stacked layer including two or more of an oxide layer, a nitride layer, or an oxy-nitride layer. For example, although not illustrated in the drawing, the insulation layer 312 may be a stacked layer including a sidewall oxide layer, formed on the sidewalls of the trench 311 through a thermal oxidation process, a liner nitride layer formed over the sidewall oxide layer, a liner oxide layer formed over the liner nitride layer, and a fluidic insulation layer (such as a Spin-On Dielectric (SOD) layer or a high-density plasma oxide (HDP)) layer to fill the trench 211 over the liner oxide layer. If the substrate 301 includes a silicon-containing material, then the insulation layer 312 may include a silicon oxynitride layer.

The second isolation structure 320 may include an impurity region 321 and 322 that serves as a potential barrier to the photoelectric conversion regions PD. The impurity region may be formed through an impurity ion implantation process and an annealing process. The implanted impurity may be accumulated on an outer boundary of the impurity region due to the characteristics of the annealing process.

In an alternative implementation, the second isolation structure 320 may have a refractive index that is smaller than a refractive index of the substrate 301, including the photoelectric conversion regions PD. The impurity region 321 and 322 may be formed to have a refractive index that is smaller than a refractive index of the substrate 301 by impurity doping the substrate 301 with a material that reduces the refractive index of the substrate. Also, since the impurity region may serve as a potential barrier to the photoelectric conversion regions PD, the impurity region may have a conductivity type that is opposite to the conductivity type of the photoelectric conversion regions PD.

For example, if the photoelectric conversion region PD has an N-type conductivity, then the impurity region 321 and 322 may have a P-type conductivity. Thus, the impurity region may be formed by doping the substrate 301 with a P-type impurity, such as a P-type metal having a refractive index that is lower than the refractive index of the material of the substrate 301. For example, if the substrate 301 includes a silicon-containing material, then the P-type metal may include, for example, silver (Ag), cobalt (Co), iron (Fe), or the like. Therefore, the P-type metal combined with substrate has a smaller refractive index than the silicon-containing material alone.

To be specific, the second isolation structure 320 may include a first impurity region 321, and a second impurity region 322 that is formed along an outer boundary of the first impurity region 321 and that has a higher impurity doping concentration than the first impurity region 321 (refer to FIG. 7A). In an alternative implementation (as shown in FIG. 7B), the second isolation structure 320 may further include a third impurity region 323 extending to an interface between the substrate 301 and the first isolation structure 310. Since the impurity doping concentration of the second impurity region 322 may be higher than that of the first impurity region 321, electrical crosstalk may be effectively prevented by increasing the size of the potential barrier at a boundary of the first impurity region 321. The third impurity region 323, which is formed between the substrate 301 and the first isolation structure 310, may prevent dangling bonds and defects between the substrate 301 and the first isolation structure 310, thereby suppressing a generation of dark current. The first impurity region 321 and the second impurity region 322 may have the same conductivity type. The third impurity region 323 may have the same conductivity type as the first impurity region 321 and the second impurity region 322. Alternatively, the third impurity region 323 may have a conductivity type that is different than the conductivity type of first impurity region 221 and the second impurity region 222. The conductivity types of the first to third impurity regions 321 to 323 may be selected based on the conductivity type of a neighboring photoelectric conversion region PD.

Further, the first isolation structure 310 and the second isolation structure 320 of the isolation structure 330 may vertically overlap each other. To be specific, the second isolation structure 320 may be stacked over the first isolation structure 310 with respect to a backside of the substrate 301. This configuration may more effectively reduce the generation of dark.

Though it is not illustrated, the isolation structure 330 may have a depth that is deeper than a depth of the photoelectric conversion regions PD, with respect to a front side of the substrate 301. This is to more effectively prevent crosstalk, as well as improve the isolation characteristics between the neighboring pixels. For example, the isolation structure 330 may penetrate through the substrate 301.

The image sensor may include an interlayer dielectric layer 303 formed on the front side of the substrate 301, a signal generation circuit [Need reference number] formed inside of the interlayer dielectric layer 303, and a passivation layer 302 formed between the substrate 301 and the interlayer dielectric layer 303. The signal generation circuit generates (or outputs) electrical signals corresponding to the electrical charges generated in the photoelectric conversion regions PD. To be specific, the signal generation circuit may include a plurality of transistors and multiple layers of metal lines 304. As shown in FIG. 1, the transistors may include a transfer transistor TX, a reset transistor RX, a selection transistor SX, and an access transistor AX. The multiple layers of metal lines 304 may be electrically connected to the transistors through a plurality of contact plugs (not shown). The passivation layer 302 may protect the signal generation circuit, particularly, the metal lines 304, from being damaged during a subsequent process. The passivation layer 302 may include a layer of a material having a thermal conductivity that is lower than a thermal conductivity the substrate 301. The passivation layer 302 may be a single layer or a stacked layer including the material layer having a thermal conductivity that is lower than the thermal conductivity of the substrate 301. For example, if the substrate 301 includes a silicon-containing material, then the passivation layer 302 may include a silicon-containing insulation layer and a metal-containing insulation layer. The silicon-containing insulation layer may include a silicon oxide layer $SiO_2$, and the metal-containing insulation layer may include a zirconium oxide layer $ZrO_2$.

The exemplary image sensor may further include a planarization layer 307 formed over the backside of the substrate 301, a color filter 305 formed over the planarization layer 307, and a micro-lens 306 formed over the color filter 305. The planarization layer 307 may have concave portions that accommodate the protruding surfaces 301A of the substrate 301.

The exemplary image sensor may effectively prevent physical or electrical crosstalk between the neighboring pixels by having the isolation structure 330 where the first isolation structure 310 and the second isolation structure 320 vertically overlap each other.

Also, since the isolation structure 330 has a refractive index that is smaller than a refractive index of the substrate 301, the physical crosstalk between the neighboring pixels may be prevented more effectively prevented.

In addition, since the impurity doping concentration of the second impurity region 322 that surrounds the first impurity region 321 is higher than the first impurity region 321, electrical crosstalk may be prevented more effectively.

Furthermore, since the third impurity region 323 extending to an interface between the substrate 301 and the first isolation structure 310 is provided, dark current may be suppressed more effectively.

Furthermore, since the protruding surface 301A of the substrate 301 is provided, the ability to focus incident light may be improved.

FIGS. 8A to 8G are cross-sectional views showing a method of fabricating the exemplary image sensor shown in FIG. 7A.

Figure 8A:
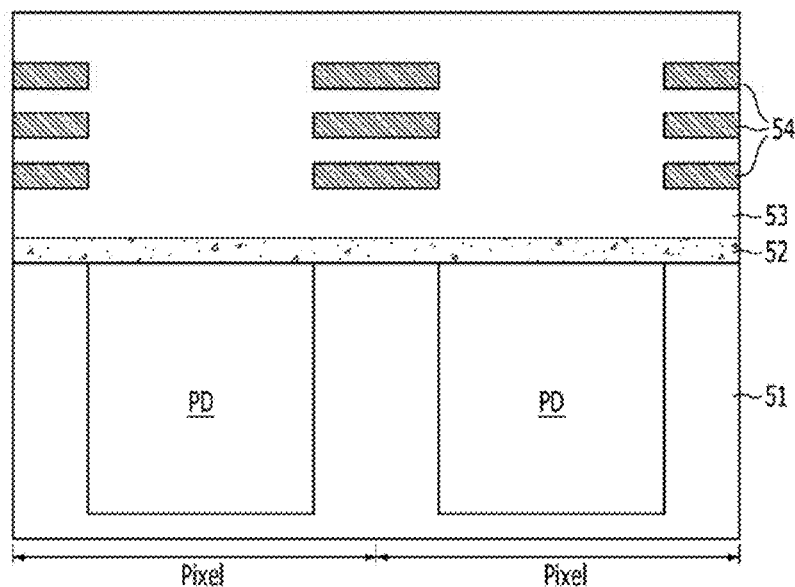
FIGS. 8A to 8G are cross-sectional views showing an exemplary method of fabricating the exemplary image sensor shown in FIG. 7A.
Figure 8B:
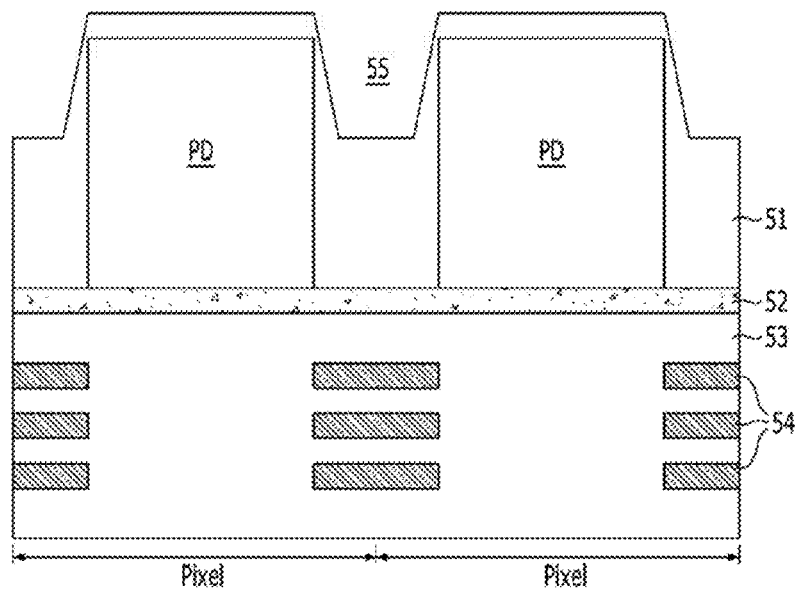

Referring to FIG. 8A, a substrate 51 where a plurality of pixels are defined is prepared. The substrate 51 may be a semiconductor substrate. The semiconductor substrate may be a monocrystalline semiconductor substrate and may include a silicon-containing material.

Subsequently, photoelectric conversion regions PD are formed in the substrate 51 to correspond to the respective pixels. The photoelectric conversion regions PD may include a plurality of photoelectric conversion units that vertically overlap each other. Each of the photoelectric conversion units may be a photodiode including an N-type impurity region and a P-type impurity region. The photodiode may be formed through an impurity ion implantation process.

A passivation layer 52 may be formed over the substrate 51, including the photoelectric conversion regions PD. The passivation layer 52 may be formed of a material having a thermal conductivity that is lower than a thermal conductivity of the substrate 51. The passivation layer 52 may be a single layer or a stacked layer. For example, if the substrate 51 includes a silicon-containing material, then the passivation layer 52 may include, for example, a silicon-containing insulation layer or a metal-containing insulation layer. The silicon-containing insulation layer may include a silicon oxide layer $SiO_2$, and the metal-containing insulation layer may include a zirconium oxide layer $ZrO_2$.

An interlayer dielectric layer 53, including a signal generation circuit, may be formed over the passivation layer 52. The interlayer dielectric layer 53 may be, for example, an oxide layer, a nitride layer, or an oxynitride layer. The interlayer dielectric layer 53 may have a multi-layer structure. The signal generation circuit generates (or outputs) electrical signals corresponding to the electrical charges generated in the photoelectric conversion regions PD. The signal generation circuit may include (as shown in FIG. 1) a plurality of transistors and multiple layers of metal lines 34. The transistors may include a transfer transistor TX, a reset transistor RX, a selection transistor SX, and an access transistor AX. The multiple layers of metal lines 54 may be electrically connected to the plurality of transistors through a plurality of contact plugs (not shown).

Referring to 8B, a mask pattern (not shown) may be formed on the backside of the substrate 51. The mask pattern may have an opening corresponding to where a first isolation structure will be formed in the substrate 51.

A trench 55 for forming a first isolation structure may be formed by selectively etching the substrate 51 by using the mask pattern (not shown) as an etch barrier. The trench 55 may have vertical sidewalls or slanted sidewalls to control the path of incident light. The etch process for forming the trench 55 may be a dry etch process.

Although not illustrated in the drawings, a thickness of the substrate 51 may be decreased by performing a thinning process on the backside of the substrate 51 after the signal generation circuit is formed. This is to increase the light reception efficiency by reducing the distance that the incident light goes to enter the photoelectric conversion regions PD. The thinning process may be performed through a backgrinding and polishing.

Figure 8C:
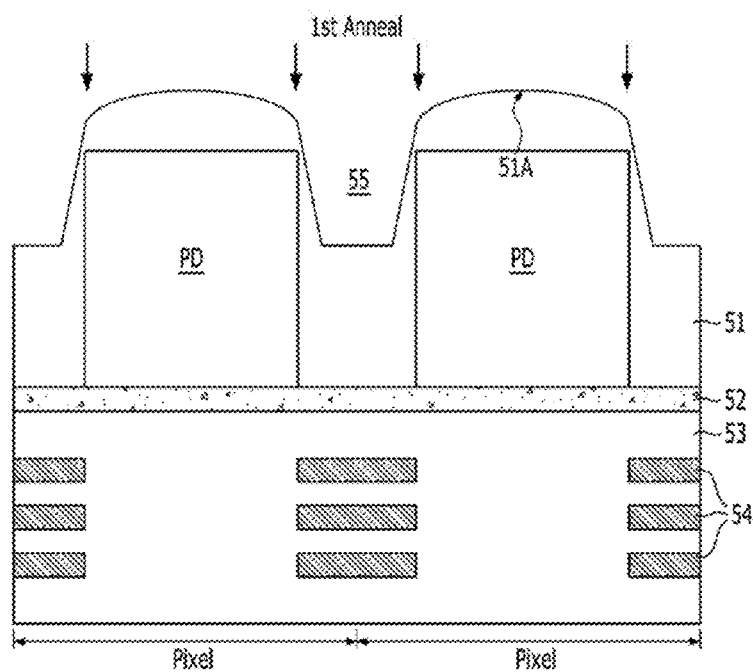

Referring to FIG. 8C, a first annealing process may be performed to form a protruding surface 51A on the backside of the substrate 51 corresponding to the photoelectric conversion regions PD. The first annealing process may be a laser annealing that may be performed locally so as to selectively form the protruding surface 51A on the backside of the substrate 51 corresponding to the photoelectric conversion regions PD. The protruding surface 51A may improve an ability to focus incident light, and may be formed by a lattice movement caused by the first annealing process.

Furthermore, any damage or defect generated on a surface of the substrate 51 that defines the trench 55 may be removed by the first annealing process, thereby preventing a generation of dark current. In addition, during the first annealing process, the passivation layer 52, which includes a material layer having a thermal conductivity that is lower than a thermal conductivity of the substrate 51, may protect the pre-formed signal generation circuit, particularly, multiple layers of metal line 54, from being damaged.

Figure 8D:
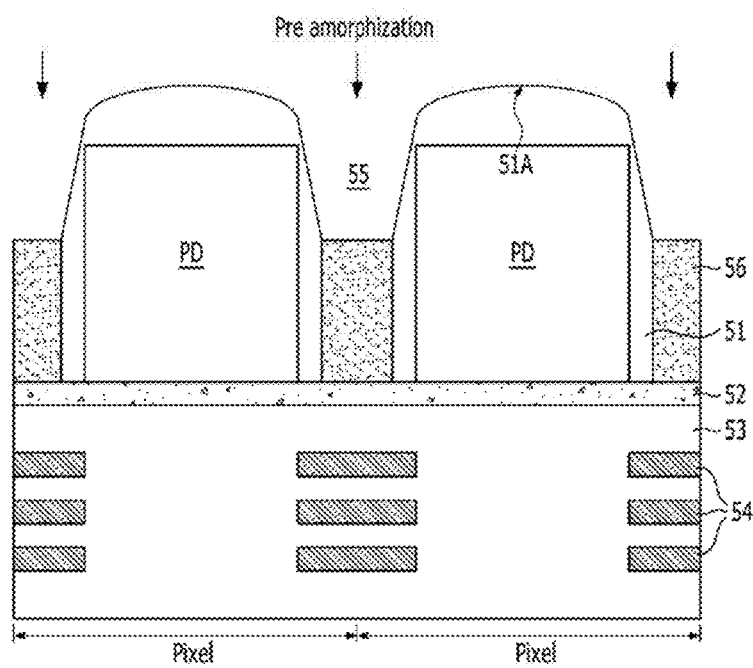

Referring to FIG. 8D, a pre-amorphization process for ion-implanting an impurity into the backside of the substrate 51 by using the mask pattern (not shown) as an ion implantation barrier is performed. If the substrate 51 is formed of a silicon-containing material, then the impurity for the pre-amorphization process may include germanium (Ge), silicon (Si), carbon (C), or the like. Through the pre-amorphization process, an amorphous region 56 may be formed in the substrate 51. The amorphous region 56 may be formed to have a generally pillar-type configuration, whose top surface forms a bottom of the trench 55 and whose bottom surface contacts the passivation layer 52.

The amorphous region 56 may have a melting temperature that is lower than a melting temperature of the substrate 51. In an exemplary implementation, the amorphous region 56 may have a melting temperature that is about 200° C. lower than a melting temperature of a monocrystalline silicon substrate.

Figure 8E:
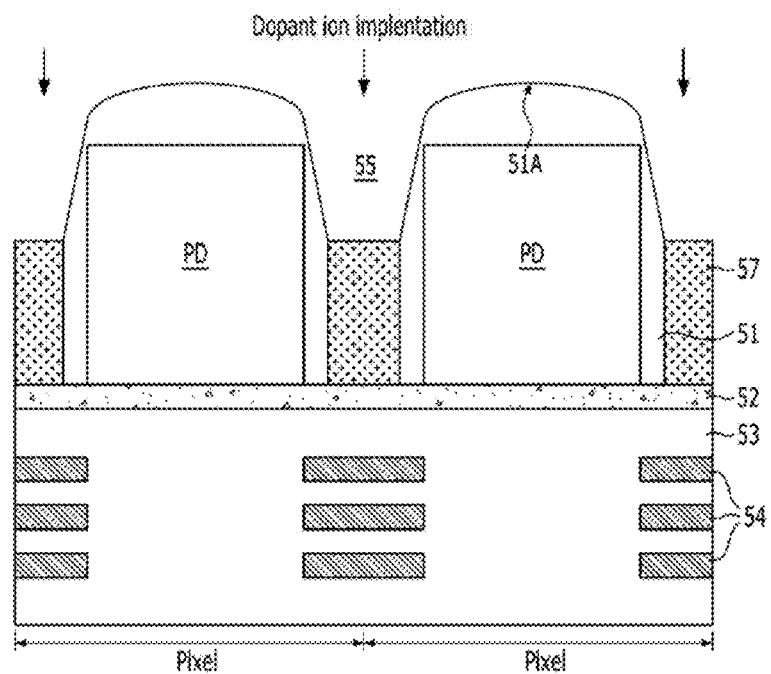

Referring to FIG. 8E, an impurity that may function as a potential barrier to the photoelectric conversion regions PD is ion-implanted into the amorphous region 56 by using the mask pattern (not shown) as an ion implantation barrier to form an amorphous impurity region 57.

The impurity that may form a potential barrier may have a conductivity type that is opposite to the conductivity type of a neighboring photoelectric conversion region PD. For example, if the neighboring photoelectric conversion region PD has an N-type conductivity, then the amorphous impurity region 57 may have a P-type impurity, such as boron (B).

According to an exemplary implementation, the impurity may be induced to have a smaller refractive index than the substrate 51 including the photoelectric conversion regions PD. The impurity that may have a refractive index that is smaller than a refractive index of the substrate 51, including the photoelectric conversion regions PD. The impurity may include, for example, a metal. For example, if the neighboring photoelectric conversion region PD has an N-type conductivity, then the amorphous impurity region 57 may have a P-type impurity, such as a P-type metal.

Figure 8F:
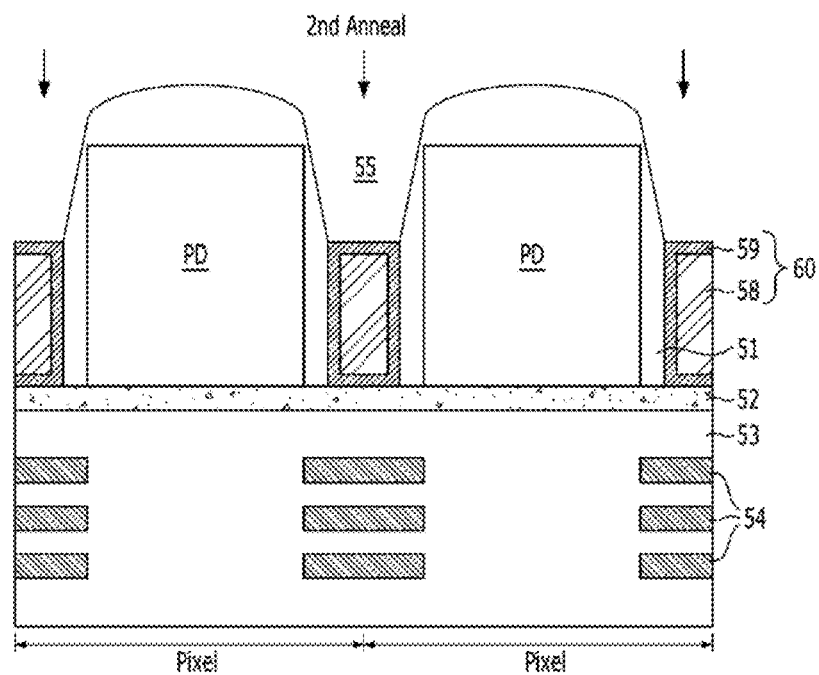
Figure 8G:
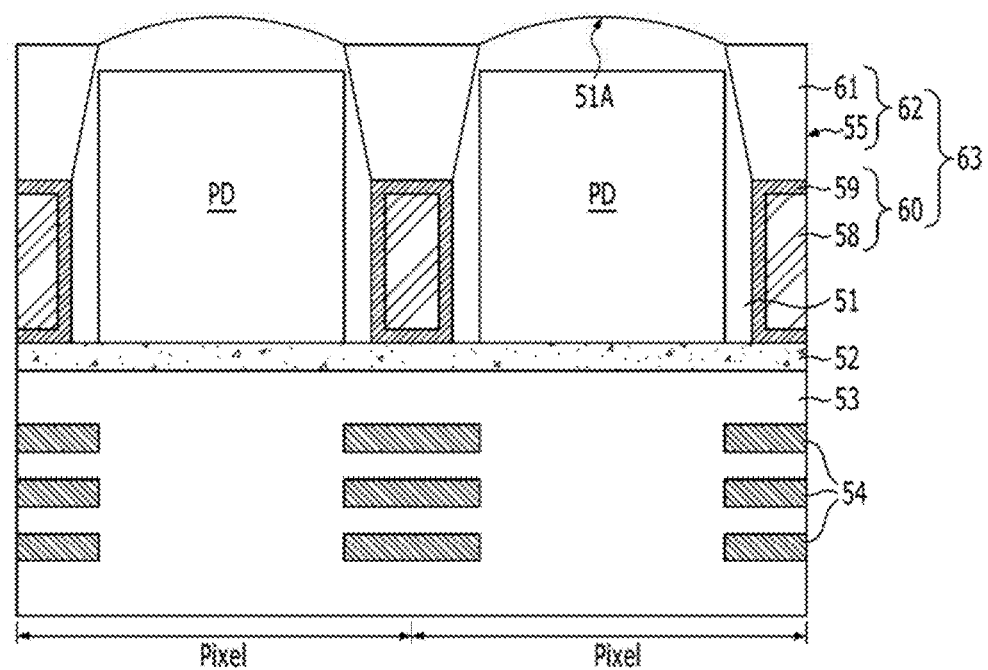

Referring to FIG. 8F, a second annealing process is performed to activate the impurity implanted into the amorphous impurity region 57 while recrystallizing the amorphous impurity region 57. The second annealing process is selectively performed only on the amorphous impurity region 57 to prevent deterioration in characteristics that may occur due to the diffusion of the implanted impurity and to reduce a thermal burden applied to the structures that are already formed. To this end, the second annealing process may be a laser annealing that may be performed locally.

During the laser annealing process, a laser beam is irradiated onto the amorphous impurity region 57 for a predetermined time, so that the amorphous impurity region 57, which as a lower melting temperature than the monocrystalline substrate 51, is melted. When the molten amorphous impurity region 57 solidifies, it crystallizes into a monocrystalline state and the implanted impurity is activated. Since the melting temperature of the substrate is higher than the melting temperature of the amorphous impurity region 57, the laser beam does not melt the substrate 51. Thus, by using an amorphous impurity region 57 having a lower melting temperature than the monocrystalline substrate 51, selective melting of the amorphous impurity region 57 may be achieved.

As a result, a second isolation structure 60 may be formed. The second isolation structure 22 may include a first impurity region 58, and a second impurity region 59 that is formed around the first impurity region 58. The second impurity region 59 may have an impurity doping concentration that is greater than an impurity doping concentration of the first impurity region 58. Since the amorphous impurity region 57 is melted during the second annealing process, quality recrystallization may be carried out and the activation rate of the implanted impurity may be improved. Also, since the impurity implanted into the boundary region is accumulated during the recrystallization process, the first impurity region 58 and the second impurity region 59 may be simultaneously formed.

Meanwhile, during the second annealing process, the passivation layer 52, which includes a material layer a thermal conductivity that is lower than a thermal conductivity of the substrate 51, may protect the pre-formed signal generation circuit, particularly, the multiple layers of metal line 54, from being damaged.

Referring to 8G, an insulation layer 61 may be formed to fill the trench 55. The insulation layer 61 may be formed by forming an insulation material over the substrate 51 to fill the trench 55 and planarizing the insulation material until the surface of the substrate 51 is exposed. The insulation layer 61 may then be partially recessed until protruding surfaces 51A are exposed.

The insulation layer 61 may be a single layer, such as, for example, an oxide layer, a nitride layer, or an oxynitride layer. Alternatively, the insulation layer 61 may be a stacked layer including two or more of the aforementioned layers. For example, although not illustrated in the drawing, the insulation layer 61 may be, for example, a stacked layer including a sidewall oxide layer, formed on the sidewalls of the trench 55 through a thermal oxidation process, a liner nitride layer formed over the sidewall oxide layer, a liner oxide layer formed over the liner nitride layer, and a fluidic insulation (such as a Spin-On Dielectric (SOD) layer or a high-density plasma oxide (HDP) layer) to fill the trench 55 over the liner oxide layer. The insulation layer 61 may have a refractive index that is smaller than a refractive index of the substrate 51.

In an exemplary implementation, the insulation layer 61 may have a refractive index that is smaller than a refractive index of the substrate 51.

As a result, a first isolation structure 62, which includes the insulation layer 61 that fills the trenches 55 formed in the substrate 51, may be formed. Further, an isolation structure 63 including the first isolation structure 62 and the second isolation structure 60 vertically overlapping each other may be formed.

Subsequently, as shown in FIGS. 7A and 7B, a conventional color filter 305 and a conventional micro-lens 306 may be formed on the backside of the substrate 301.

With the isolation structure 63 where the first isolation structure 62 and the second isolation structure 60 vertically overlap each other, the image sensor formed through the above-described fabrication process may effectively prevent physical or electrical crosstalk between neighboring pixels.

Also, since the isolation structure 63 has a smaller refractive index than does the substrate 51, the second isolation structure 60 may effectively prevent the physical crosstalk between the neighboring pixels.

Also, since the impurity doping concentration of the second impurity region 59, which surrounds the first impurity region 58, is greater than the impurity doping concentration of the first impurity region 58, the second isolation structure 60 may effectively prevent the electrical crosstalk.

Furthermore, since the protruding surface 51A of the substrate 51 is provided by the first annealing process, an ability to focus incident light may be improved, and a generation of dark current may be more effectively prevented.

Moreover, through the annealing process where the amorphous region 57, which has a melting temperature that is lower than the melting temperature of the monocrystalline-state substrate 51, is selectively melted, it is possible to prevent the deterioration in characteristics caused by the diffusion of the implanted impurity and alleviate the thermal burden applied to the structures that are already formed.

Figure 9:
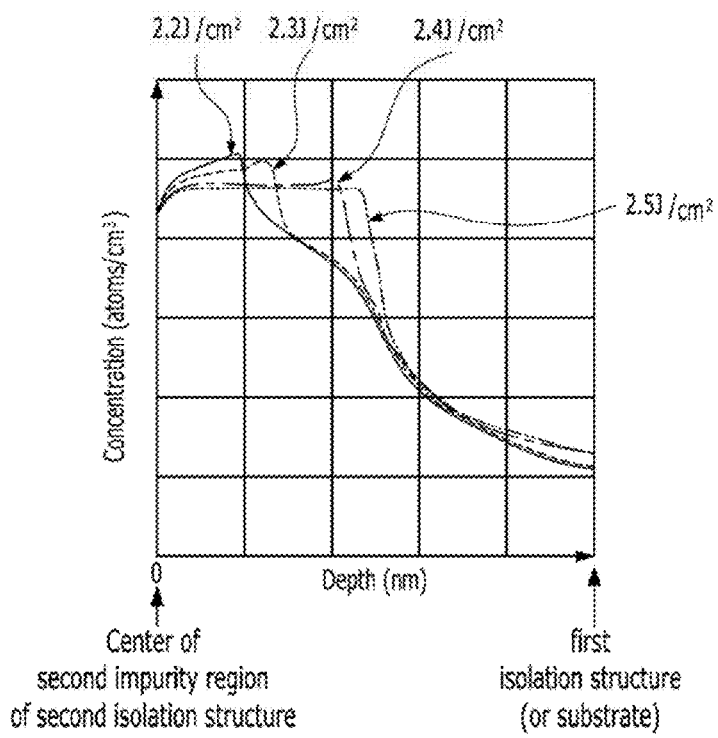
FIG. 9 is a graph showing an impurity doping concentration of an impurity region formed through an exemplary laser annealing process.

FIG. 9 is a graph showing an impurity doping concentration of an impurity region formed through an exemplary laser annealing process.

Referring to FIG. 9, it may be confirmed that the impurity activated by the laser annealing process including selective melting is accumulated in the boundary region between the second isolation structure and the first isolation structure (or the substrate). In other words, it may be seen that the first impurity region and the second impurity region having a higher impurity doping concentration than the first impurity region, in the second isolation structure, are formed through the laser annealing process including the selective melting. For reference, a 'depth' shown in FIG. 9 denotes a direction from a center of the second impurity region in the second isolation structure to the first isolation structure (or the substrate).

In addition, the first impurity region maintains a relatively uniform impurity doping concentration according to the variation of depth, and the depth of the second isolation structure may be adjusted based on the laser irradiation energy.

Figure 10:
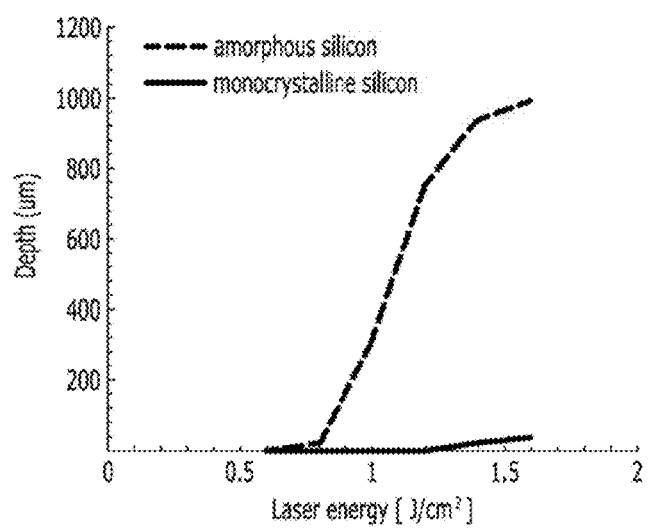
FIG. 10 is a graph showing a state of amorphous silicon and monocrystalline silicon based on a level of laser energy.

FIG. 10 is a graph showing a state of amorphous silicon and monocrystalline silicon based on a level of laser energy.

Referring to FIG. 10, it may be seen that selective melting may be performed due to the difference in the crystalline structure when the laser of the same energy is irradiated to amorphous silicon and monocrystalline silicon. In other words, amorphous silicon and monocrystalline silicon have different melting temperatures due to their difference in crystalline structures. By taking advantage of the difference, the amorphous silicon may be selectively molten.

Figure 11:
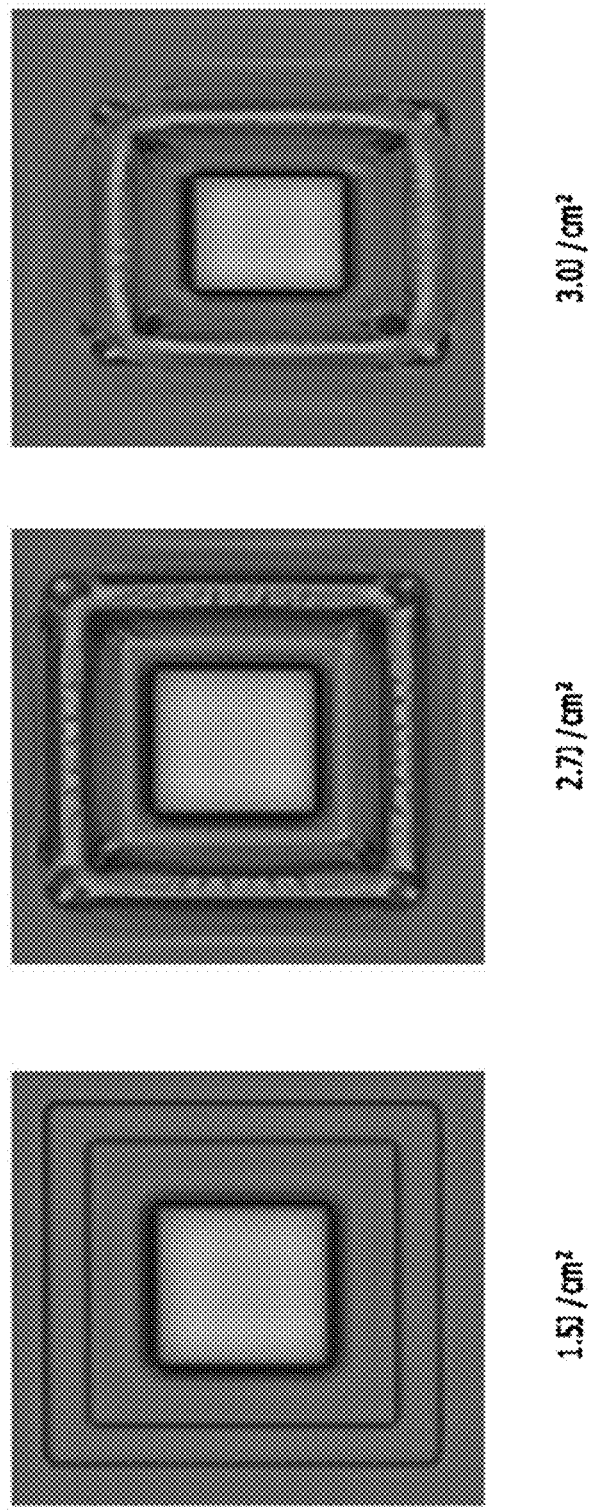
FIG. 11 shows lattice movement as a result of laser annealing.

FIG. 11 shows lattice movement according to laser annealing.

Referring to FIG. 11, as the laser irradiation energy is increased, the edges of a square (which corresponds to the trenches in the third implementation of the present invention) become rounded. In short, since silicon lattice moves due to the laser annealing to have a modified shape, it is possible to form a protruded surface.

Figure 12:
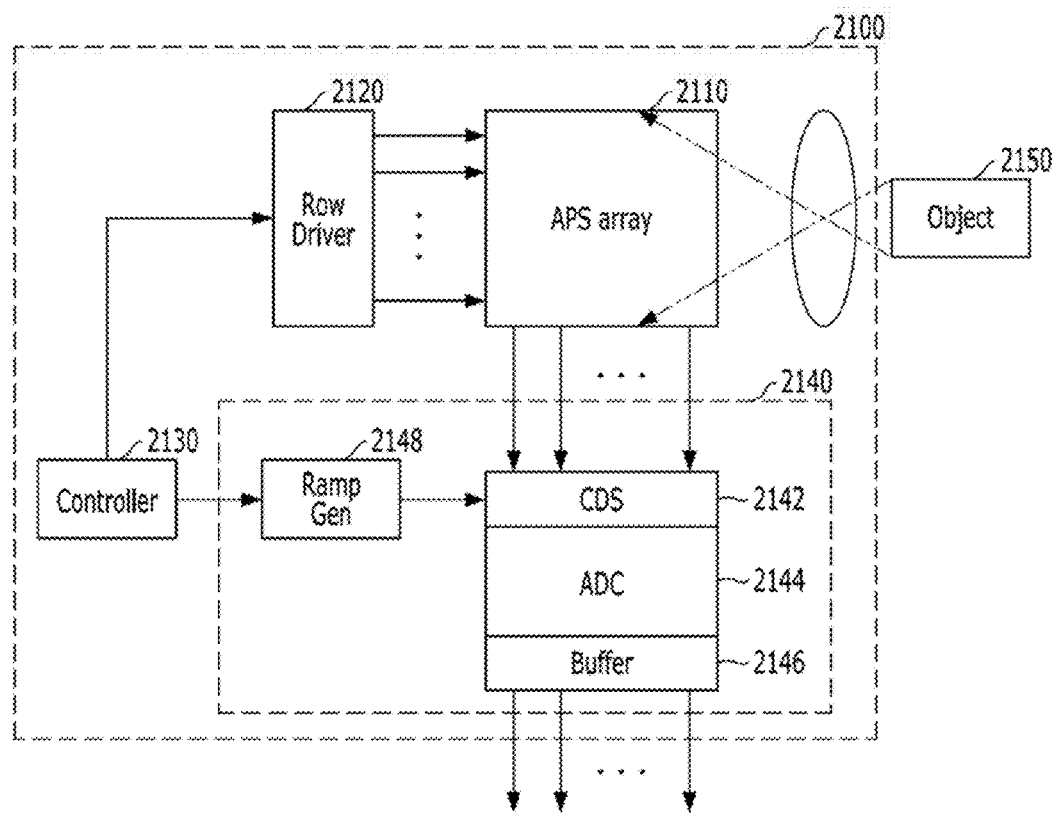
FIG. 12 is a block diagram illustrating a configuration of an exemplary image sensing device.

FIG. 12 is a block diagram illustrating an exemplary image sensing device.

Referring to FIG. 12, an image sensing device 2100 may include an active pixel sensor array (APS array) 2110, a controller 2130, a row driver 2120, and a pixel signal processor 2140. The active pixel sensor array 2110 may include the exemplary image sensor. The image sensing device 2100 may be used as a CMOS image sensor.

The active pixel sensor array 2110 outputs electrical pixel signals corresponding to incident light by converting the electrical pixel signals in a plurality of photoelectric conversion regions PD. The electrical pixel signals are provided to the pixel signal processor 2140 through vertical signal lines. Pixel sensors in the active pixel sensor array 2110 are read out one by one once in units of rows. Accordingly, all of the pixels in one row of the active pixel sensor array 2110 are simultaneously activated by a row selection signal which is an output of the row driver 2120.

Each pixel in the selected row provides a signal, which corresponds to incident light, to an output line of a corresponding column. In the active pixel sensor (APS) array 2110, each column includes a selection line and the pixels in each column are selectively read out in response to a column selection signal. The rows in the active pixel sensor (APS) array 2110 are activated in response to an output signal of the row driver 2120.

The controller 2130 controls the row driver 2120 and the pixel signal processor 2140 to perform a process suitable for a pixel signal output from the active pixel sensor array 2110. The pixel signal processor 2140 includes a correlated double sampler (CDS) 2142, an analog-digital converter (ADC) 2144, and a buffer 2146.

The correlated double sampler (CDS) 2142 receives the electrical pixel signals generated in the active pixel sensor array 2110 via a vertical signal line, and then samples and holds the electrical pixel signals. That is, the correlated double sampler 2142 doubly samples a specified noise level and a signal level of the generated electrical pixel signals and outputs a difference level corresponding to a difference between the noise level and the signal level. Ramp signal values generated from a ramp signal generator (Ramp Gen) 2148 may be input and compared to each other, and then the comparison result may be output to an output end. The ramp signal generator (Ramp Gen) 2148 may operate based on a control signal generated from the controller 2130.

The analog-digital converter (ADC) 2144 converts an analog signal corresponding to the difference level into a digital signal. The buffer 2146 includes a column memory block (not illustrated) and a sense amplifier (not illustrated). The column memory block (not illustrated) may include a plurality of memories (not illustrated).

The buffer 2146 latches the digital signal. The latched signal is output sequentially to an image processor (not illustrated) according to a decoding result of a column decoder (not illustrated).

The image sensing device 2100 in FIG. 12 may be realized as one semiconductor chip by further including an image processor (not illustrated). The image processor (not illustrated) performs appropriate image processing on digitized pixel signals and outputs image data. The image sensing device 2100 senses an object 2150 imaged by a lens under the control of the image processor (not illustrated). The image processor (not illustrated) may output an image sensed and output by the image sensing device 2100 to a display unit (not illustrated). At this time, the display unit (not illustrated) includes all of the devices capable of outputting a video. For example, the display unit (not illustrated) may include a computer, a cellular phone, and other video output terminals. The image sensing device 2100 illustrated in FIG. 12 may include the exemplary image sensor. Accordingly, image data undamaged by crosstalk caused between adjacent pixels and a dark current may be output.

Figure 13:
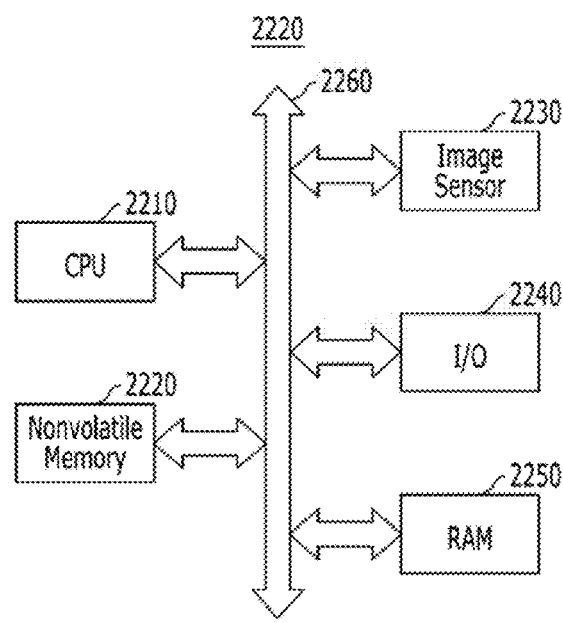
FIG. 13 is a block diagram illustrating a system including an exemplary image sensor according.

FIG. 13 is a block diagram illustrating a system including an exemplary image sensor.

Here, a system 2200 in FIG. 13 may be a computer system, a camera system, a scanner, a car navigation, a video phone, a security system, a motion detection system, or any system in which image data is necessary.

As illustrated in FIG. 13, the system 2200 includes a central processing unit (CPU) 2210 or a processor 2210, a non-volatile memory 2220, an image sensor 2230, an input/output (I/O) device 2240, a random access memory (RAM) 2250.

The central processing unit (CPU) 2210 communicates with the input/output (I/O) device 2240 via a bus 2260.

The image sensor 2230 communicates with the central processing unit (CPU) 2210 via the bus 2260. The RAM 2250 and the non-volatile memory 2220 also communicate with the central processing unit (CPU) 2210 via the bus 2260. The image sensor 2230 may be present as an independent semiconductor chip or may be coupled with the central processing unit 2210 to form one semiconductor chip.

The image sensor 2230 included in the system in FIG. 13 may include the image sensor according to the first to third implementations of the present invention. Accordingly, image data undamaged by crosstalk caused between adjacent pixels and a dark current may be output.

While the present invention has been described with respect to the specific implementations, it will be apparent to those skilled in the art that various changes and modifications may be made without departing from the spirit and scope of the invention as defined in the following claims.

What is claimed is:

1. An isolation structure for isolating a plurality of device regions from each other, the isolation structure comprising:
   a first isolation structure having an insulation layer formed in a trench in a substrate; and
   a second isolation structure, formed on the first isolation structure, the second isolation structure including:
      a first impurity region formed in the substrate, the first impurity region having a first impurity doping concentration, and
      a second impurity region that is formed to surround the first impurity region, the second impurity region having a second impurity doping concentration that is greater than the first doping concentration.

2. The isolation structure of claim 1, wherein the second isolation structure further comprises:
   a third impurity region formed between the substrate and the first isolation structure.

3. The isolation structure of claim 1, wherein the first impurity region and the second impurity region comprise:
   an impurity that functions as a potential barrier between portions of the substrate corresponding to the device regions.

4. The isolation structure of claim 1, wherein the second isolation structure is formed, with respect to a backside of the substrate, over the first isolation structure, or the first isolation structure is formed, with respect to the backside of the substrate, over the second isolation structure.

5. The isolation structure of claim 1, wherein the first isolation structure and the second isolation structure penetrate through the substrate.

6. An image sensor comprising:
   a substrate;
   a plurality of photoelectric conversion regions formed in the substrate, wherein each of the photoelectric conversion regions corresponds to a pixel of the image sensor; and
   an isolation structure formed in the substrate, between each of the plurality of photoelectric conversion regions, the isolation structure comprising:
      a first isolation structure formed in a trench in the substrate, and
      a second isolation structure formed adjacent to the first isolation structure, the second isolation structure including:
         a first impurity region formed in the substrate, the first impurity region having a first impurity doping concentration, and
         a second impurity region formed to surround the first impurity region, the second impurity region having a second impurity doping concentration that is greater than the first impurity doping concentration.

7. The image sensor of claim 6, wherein the second isolation structure further comprises:
   a third impurity region formed between the substrate and the first isolation structure.

8. The image sensor of claim 6, wherein the second isolation structure includes an impurity that functions as a potential barrier between the plurality of photoelectric conversion regions.

9. The image sensor of claim 6, wherein a refractive index of the second isolation structure is less than a refractive index of the substrate.

10. The image sensor of claim 9, wherein the first impurity region and the second impurity region are doped with an impurity having a conductivity type that is opposite to a conductivity type of the substrate and the plurality of photoelectric conversion regions.

11. The image sensor of claim 6, wherein the second isolation structure is formed above the first isolation structure with respect to a backside of the substrate, or the first isolation structure is formed above the second isolation structure with respect to the backside of the substrate.

12. The image sensor of claim 6, wherein the isolation structure has a depth that is greater than a depth of the photoelectric conversion regions.

13. The image sensor of claim 6, wherein the isolation structure penetrates through an entire thickness of the substrate.

14. The image sensor of claim 6, further comprising:
   a passivation layer formed over a front side of the substrate;
   an interlayer dielectric layer, including metal lines, formed over the passivation layer; and
   a protruding surface formed over a backside of the substrate corresponding to the photoelectric conversion regions.

15. The image sensor of claim 14, wherein the passivation layer has a thermal conductivity that is lower than a thermal conductivity of the substrate.

16. An image sensing device comprising:
   an active pixel sensor array suitable for outputting pixel signals corresponding to incident light;
   a row driver suitable for driving a readout operation by simultaneously activating all of pixels in one row of the active pixel sensor array;
   a pixel signal processor suitable for receiving the pixel signals output from the active pixel sensor array to output digital signals by sampling the pixel signals; and
   a controller suitable for controlling the row driver and the pixel signal processor to perform a process suitable for the pixel signals, wherein the active pixel sensor array includes:
  a substrate;
  a plurality of photoelectric conversion regions formed in the substrate, wherein each of the photoelectric conversion regions corresponds to a pixel of the active pixel sensor array; and
  an isolation structure formed in the substrate, between each of the plurality of photoelectric conversion regions, the isolation structure comprising:
  a first isolation structure formed in a trench in the substrate, and
  a second isolation structure formed adjacent to the first isolation structure, the second isolation structure including:
  a first impurity region formed in the substrate, the first impurity region having a first impurity doping concentration, and
  a second impurity region formed to surround the first impurity region, the second impurity region having a second impurity doping concentration that is greater than the first impurity doping concentration.

17. The image sensing device of claim 16, wherein the pixel signal processor comprises:
  a ramp signal generator suitable for a ramp signal in response to a control signal generated from the controller;
  a correlated double sampler (CDS) suitable for sampling and holding the pixel signals, and comparing the sampled pixel signals with the ramp signal to output a comparison result;
  an analog-digital converter (ADC) suitable for converting the comparison result into a digital signal; and
  a buffer suitable for latching the digital signal.

18. The image sensing device of claim 16, wherein the second isolation structure further comprises:
  a third impurity region formed between the substrate and the first isolation structure.

19. The image sensing device of claim 16, wherein a refractive index of the second isolation structure is less than a refractive index of the substrate.

20. The image sensing device of claim 16, wherein the isolation structure has a depth that is greater than a depth of the photoelectric conversion regions.

* * * * *